US007019604B2

(12) United States Patent
Gotoh et al.

(10) Patent No.: US 7,019,604 B2
(45) Date of Patent: Mar. 28, 2006

(54) PIEZOELECTRIC FILTER, DUPLEXER, COMPOSITE PIEZOELECTRIC RESONATOR, COMMUNICATION DEVICE AND METHOD FOR ADJUSTING FREQUENCY OF PIEZOELECTRIC FILTER

(75) Inventors: Yoshihiko Gotoh, Shiga-ken (JP); Hajime Yamada, Otsu (JP); Tadashi Nomura, Kyoto (JP); Masaki Takeuchi, Otsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 195 days.

(21) Appl. No.: 10/623,856

(22) Filed: Jul. 18, 2003

(65) Prior Publication Data

US 2004/0017269 A1 Jan. 29, 2004

(30) Foreign Application Priority Data

Jul. 23, 2002 (JP) ...................................... 2002-213773
Jun. 19, 2003 (JP) ...................................... 2003-175235

(51) Int. Cl.
*H03H 9/17* (2006.01)

(52) U.S. Cl. ........................ 333/187; 333/189; 333/191

(58) Field of Classification Search ................. 333/187, 333/189, 191
See application file for complete search history.

(56) References Cited

U.S. PATENT DOCUMENTS 6,307,447 B1 * 10/2001 Barber et al. ............... 333/189
6,339,276 B1 1/2002 Barber et al.
6,407,649 B1 * 6/2002 Tikka et al. ................ 333/133
6,483,229 B1 * 11/2002 Larson et al. ............... 310/348

FOREIGN PATENT DOCUMENTS

| | | |
|---|---|---|
| EP | 1 187 318 A2 | 3/2002 |
| JP | 10-154916 | 6/1998 |
| JP | 2001-177363 | 6/2001 |
| JP | 2001-196882 | 7/2001 |
| JP | 2002-217663 | 8/2002 |
| JP | 2002-299980 | 10/2002 |
| JP | 2002-335141 | 11/2002 |
| JP | 2002-359539 | 12/2002 |

* cited by examiner

*Primary Examiner*—Anh Q. Tran
(74) *Attorney, Agent, or Firm*—Keating & Bennett, LLP

(57) ABSTRACT

A piezoelectric filter and other electronic components are constructed such that the accuracy of frequency adjustment can be increased and an improvement in efficiency of the adjustment operation can be achieved. The piezoelectric filter includes a plurality of piezoelectric resonators including a substrate and a vibration portion provided on the substrate, the vibration portion having a structure in which the top and bottom surfaces of a thin film portion including at least one piezoelectric thin film are sandwiched between at least a pair of an upper electrode and a lower electrode facing each other, wherein the upper electrode of a predetermined piezoelectric resonator is made of a material having susceptibility to etching that is different from that of the upper electrode of the other piezoelectric resonator.

28 Claims, 24 Drawing Sheets

PIEZOELECTRIC FILTER, DUPLEXER, COMPOSITE PIEZOELECTRIC RESONATOR, COMMUNICATION DEVICE AND METHOD FOR ADJUSTING FREQUENCY OF PIEZOELECTRIC FILTER

BACKGROUND OF THE INVENTION

1. Field of the Invention

The present invention relates to a piezoelectric filter, a duplexer including the piezoelectric filter, a composite piezoelectric resonator, a communication device and a method for adjusting the frequency of a piezoelectric filter.

2. Description of the Related Art

Some types of piezoelectric filter include a plurality of energy-trap type, e.g. thickness longitudinal vibration type, piezoelectric resonators as vibration portions. With respect to such a piezoelectric filter, in general, a frequency band for filtering operation is determined by individually adjusting the thickness of each vibration portion.

Three methods are known for adjusting the thickness. The methods include (1) a method in which a film is added to the electrode of each vibration portion by evaporation, sputtering or other process while portions other than the required electrode are covered with a resist through the use of photolithography in order that the film thickness is selectively increased, (2) a method in which etching is performed to decrease the film thicknesses of the electrode and the like while the course of an ion beam is adjusted (refer to Patent literature 1) and (3) a method in which the frequency is adjusted by forming a plurality of fine holes in an electrode through the use of a laser (refer to Patent literature 2).

Patent literature 1 is Japanese Unexamined Patent Application Publication No. 2001-196882 and Patent literature 2 is Japanese Unexamined Patent Application Publication No. 10-154916.

With respect to the above-described method (1), the film thickness precision in the film formation with a general film formation apparatus is on the order of a low ±1%. In this case, not only the variations in targeted frequency are on the order of ±1%, but also, for example, the difference between the respective resonant frequencies of a series resonator and a parallel resonator constituting a ladder filter varies on the order of ±1% relative to a desired setting in the same wafer for manufacturing a filter.

With respect to the above-described methods (2) and (3), the frequency can simply be adjusted on an element basis. Consequently, the adjustment can be performed while the frequency characteristic is measured on an element basis, so that highly accurate adjustment can be performed. However, many adjustment steps are required for the adjustment, and thereby, the operation efficiency is significantly reduced.

SUMMARY OF THE INVENTION

In order to overcome the problems described above, preferred embodiments of the present invention provide a piezoelectric filter and other electronic components in which the accuracy of frequency adjustment is increased and an improvement in efficiency of the adjustment operation is achieved.

A first piezoelectric filter according to a preferred embodiment of the present invention includes a plurality of piezoelectric resonators including a substrate and a vibration portion provided on the substrate, the vibration portion having a structure in which the top and bottom surfaces of a thin film portion including at least one piezoelectric thin film are sandwiched between at least a pair of an upper electrode and a lower electrode facing each other, wherein the upper electrode of a predetermined piezoelectric resonator is made of a material having susceptibility to etching that is different from that of the upper electrodes of the other piezoelectric resonators.

According to the first piezoelectric filter of preferred embodiments of the present invention, a reduction in thickness of the vibration portion of the piezoelectric resonator is achieved by performing a treatment in which upper electrodes of the plurality of piezoelectric resonators are etched, and in addition, since the susceptibility to etching of the upper electrode of the predetermined piezoelectric resonator is different from that of the upper electrodes of the other piezoelectric resonators, when individual vibration portions of the plurality of piezoelectric resonators are simultaneously etched, the degrees of reduction in thickness are different from each other. Therefore, the frequency of a specific resonator can be selectively adjusted. Furthermore, the desired frequency adjustment with respect to each vibration portion can be performed by one operation during the etching. In particular, when the substrate is configured to include an opening on the back, the frequency of the total piezoelectric filter can also be adjusted by cutting away the vibration portion from the back in order to reduce the thickness or by adding a film to the back of the vibration portion.

A second piezoelectric filter according to preferred embodiments of the present invention includes a plurality of piezoelectric resonators including a substrate and a vibration portion provided on the substrate, the vibration portion having a structure in which the top and bottom surfaces of a thin film portion including at least one piezoelectric thin film are sandwiched between at least a pair of an upper electrode and a lower electrode facing each other, wherein an additional film is provided on the upper electrode of a predetermined piezoelectric resonator, and the additional film has susceptibility to etching that is different from that of the materials for the upper electrodes of the other piezoelectric resonators.

Preferably, the upper electrodes of the plurality of piezoelectric resonators are preferably made of the same material.

According to the second piezoelectric filter of preferred embodiments of the present invention, a reduction in thickness of the vibration portion of the piezoelectric resonator is achieved by performing a treatment in which upper electrodes of the plurality of piezoelectric resonators are etched, and in addition, since the additional film is provided on the upper electrode of the predetermined piezoelectric resonator, and the additional film has susceptibility to etching that is different from that of the materials for the upper electrodes of the other piezoelectric resonators, when individual vibration portions of the plurality of piezoelectric resonators are simultaneously etched, the degrees of reduction in thickness are different from each other. Therefore, the frequency of a specific resonator can be selectively adjusted. Furthermore, the desired frequency adjustment with respect to each vibration portion can be performed by one operation during the etching. In particular, when the substrate is configured to include an opening on the back, the frequency of the total piezoelectric filter can also be adjusted by cutting away the vibration portion from the back in order to reduce the thickness or by adding a film to the back of the vibration portion.

A third piezoelectric filter according to preferred embodiments of the present invention includes a plurality of piezoelectric resonators including a substrate and a vibration portion provided on the substrate, the vibration portion having a structure in which the top and bottom surfaces of a thin film portion including at least one piezoelectric thin film are sandwiched between at least a pair of an upper electrode and a lower electrode facing each other, wherein the vibration portions of the plurality of piezoelectric resonators are covered with a protective film, and an additional electrode is provided on the upper electrode of a predetermined piezoelectric resonator with the protective film therebetween.

According to the third piezoelectric filter of preferred embodiments of the present invention, a reduction in thickness of the vibration portion of the piezoelectric resonator is achieved by performing a treatment in which upper electrodes of the plurality of piezoelectric resonators are etched, and in addition, since the vibration portions of the plurality of piezoelectric resonators are covered with a protective film, and the additional electrode is provided on the upper electrode of the predetermined piezoelectric resonator with the protective film being disposed therebetween, when individual vibration portions of the plurality of piezoelectric resonators are simultaneously etched, the degrees of reduction in thickness are different from each other. Therefore, the frequency of a specific resonator can be selectively adjusted. Furthermore, the desired frequency adjustment with respect to each vibration portion can be performed by one operation during the etching. In particular, when the substrate is configured to include an opening on the back, the frequency of the total piezoelectric filter can also be adjusted by cutting away the vibration portion from the back in order to reduce the thickness or by adding a film to the back of the vibration portion.

In any one of the first to third piezoelectric filters according to preferred embodiments of the present invention, preferably, the above-described piezoelectric thin film primarily includes ZnO or AlN.

In any one of the first to third piezoelectric filters according to preferred embodiments of the present invention, preferably, the substrate has an opening or a concave portion, and the vibration portion is provided on the above-described opening or concave portion.

A fourth piezoelectric filter according to preferred embodiments of the present invention includes a plurality of piezoelectric resonators including a piezoelectric substrate and a vibration portion having a structure in which the piezoelectric substrate is sandwiched between at least a pair of an upper electrode and a lower electrode facing each other, wherein the upper electrode of a predetermined piezoelectric resonator is made of a material having susceptibility to etching that is different from that of the upper electrodes of the other piezoelectric resonators.

According to the fourth piezoelectric filter of preferred embodiments of the present invention, a reduction in thickness of the vibration portion of the piezoelectric resonator is achieved by performing a treatment in which upper electrodes of the plurality of piezoelectric resonators are etched, and in addition, since the susceptibility to etching of the upper electrode of the predetermined piezoelectric resonator is different from that of the upper electrodes of the other piezoelectric resonators, when individual vibration portions of the plurality of piezoelectric resonators are simultaneously etched, the degrees of reduction in thickness are different from each other. Therefore, the frequency of a specific resonator can be selectively adjusted. Furthermore, the desired frequency adjustment with respect to each resonator can be performed by one operation during the etching of the upper electrodes.

A fifth piezoelectric filter according to preferred embodiments of the present invention includes a plurality of piezoelectric resonators including a piezoelectric substrate and a vibration portion having a structure in which the piezoelectric substrate is sandwiched between at least a pair of an upper electrode and a lower electrode facing each other, wherein an additional film is provided on the upper electrode of a predetermined piezoelectric resonator, and the additional film has susceptibility to etching that is different from that of the material for the upper electrode.

According to the fifth piezoelectric filter of preferred embodiments of the present invention, a reduction in thickness of the vibration portion of the piezoelectric resonator is achieved by performing a treatment in which upper electrodes of the plurality of piezoelectric resonators are etched, and in addition, since the additional film is provided on the upper electrode of the predetermined piezoelectric resonator, and the additional film has susceptibility to etching different from that of the material for the upper electrode, when individual vibration portions of the plurality of piezoelectric resonators are simultaneously etched, the degrees of reduction in thickness are different from each other. Therefore, the frequency of a specific resonator can be selectively adjusted. Furthermore, the desired frequency adjustment with respect to each resonator can be performed by one operation during the etching of the upper electrodes.

In the fourth or fifth piezoelectric filter according to preferred embodiments of the present invention, preferably, the vibration portions of the plurality of piezoelectric resonators are covered with a protective film, and an additional electrode is provided on the upper electrode of a predetermined piezoelectric resonator with the protective film being disposed therebetween. In this case, a reduction in thickness of the vibration portion of the piezoelectric resonator is achieved by performing a treatment in which upper electrodes of the plurality of piezoelectric resonators are etched, and in addition, since the vibration portions of the plurality of piezoelectric resonators are covered with the protective film, and the additional electrode is provided on the upper electrode of the predetermined piezoelectric resonator with the above-described protective film therebetween, when individual vibration portions of the plurality of piezoelectric resonators are simultaneously etched, the degrees of reduction in thickness are different from each other. Therefore, the frequency of a specific resonator can be selectively adjusted. Furthermore, the desired frequency adjustment with respect to each piezoelectric resonator can be performed by one operation during the etching.

In the fourth or fifth piezoelectric filter according to preferred embodiments of the present invention, preferably, the lower electrode of at least one of the plurality of piezoelectric resonators is made of a material having susceptibility to etching that is different from that of the lower electrodes of the other piezoelectric resonators. In this case, the frequency adjustment can be performed by the etching of not only the upper electrodes, but also the lower electrodes in a manner similar to that in the upper electrodes, and etching can be performed with respect to the lower electrodes simultaneously with the upper electrodes. Consequently, with respect to both the upper electrodes and the lower electrodes, the materials of the surfaces to be etched are adjusted to have different susceptibility to etching, and therefore, it is possible to adjust the frequency of a specific resonator or a specific group of resonators by etching of the upper electrodes, and to adjust the frequencies of the other resonators or the other groups of resonators by etching of the lower electrodes, so that the frequency adjustment can be selectively performed on a vibration portion basis.

In the fourth or fifth piezoelectric filter according to preferred embodiments of the present invention, preferably, an additional film is provided on the lower electrode of at least one of the plurality of piezoelectric resonators, and the additional film has susceptibility to etching that is different from that of the materials for the lower electrodes of the other piezoelectric resonators. In this case, the frequency adjustment can be performed by the etching of not only the upper electrodes, but also the lower electrodes in a manner similar to that in the upper electrodes.

In the fourth or fifth piezoelectric filter according to preferred embodiments of the present invention, preferably, at least a portion of the plurality of the vibration portions share a lower electrode. In this case, since at least a portion of the lower electrodes are shared, the frequencies of some specific resonators as well as the other resonators can be adjusted by one operation.

In any one of the first to fifth piezoelectric filters according to preferred embodiments of the present invention, the piezoelectric resonators may be arranged in a ladder configuration.

A duplexer according to another preferred embodiment of the present invention includes any one of the first to fifth piezoelectric filters of preferred embodiments of the present invention.

A first composite piezoelectric resonator according to yet another preferred embodiment of the present invention is provided with a plurality of piezoelectric resonators including a substrate and a vibration portion provided on the substrate, the vibration portion having a structure in which the top and bottom surfaces of a thin film portion including at least one piezoelectric thin film are sandwiched between at least a pair of an upper electrode and a lower electrode facing each other, wherein the upper electrode of a predetermined piezoelectric resonator is made of a material having susceptibility to etching that is different from that of the upper electrodes of the other piezoelectric resonators.

According to the first composite piezoelectric resonator of preferred embodiments of the present invention, a reduction in thickness of the vibration portion of the piezoelectric resonator is achieved by performing a treatment in which upper electrodes of the plurality of piezoelectric resonators are etched, and in addition, since the susceptibility to etching of the upper electrode of the predetermined piezoelectric resonator is different from that of the upper electrodes of the other piezoelectric resonators, when individual vibration portions of the plurality of piezoelectric resonators are simultaneously etched, the degrees of reduction in thickness are different from each other. Therefore, the frequency of a specific resonator can be selectively adjusted. Furthermore, the desired frequency adjustment with respect to each vibration portion can be performed by one operation during the etching. In particular, when the substrate is configured to include an opening on the back, the frequency of the total composite piezoelectric resonator can also be adjusted by cutting away the vibration portion from the back in order to reduce the thickness or by adding a film to the back of the vibration portion.

A second composite piezoelectric resonator according to preferred embodiments of the present invention is provided with a plurality of piezoelectric resonators including a substrate and a vibration portion provided on the substrate, the vibration portion having a structure in which the top and bottom surfaces of a thin film portion including at least one piezoelectric thin film are sandwiched between at least a pair of an upper electrode and a lower electrode facing each other, wherein the upper electrodes of the plurality of piezoelectric resonators are made of the same material, an additional film is provided on the upper electrode of a predetermined piezoelectric resonator, and the additional film has susceptibility to etching different from that of the material for the upper electrode.

According to the second composite piezoelectric resonator of preferred embodiments of the present invention, a reduction in thickness of the vibration portion of the piezoelectric resonator is achieved by performing a treatment in which upper electrodes of the plurality of piezoelectric resonators are etched, and in addition, since the additional film is provided on the upper electrode of the predetermined piezoelectric resonator, and the additional film has susceptibility to etching different from that of the material for the upper electrode, when individual vibration portions of the plurality of piezoelectric resonators are simultaneously etched, the degrees of reduction in thickness are different from each other. Therefore, the frequency of a specific resonator can be selectively adjusted. Furthermore, the desired frequency adjustment with respect to each vibration portion can be performed by one operation during the etching. In particular, when the substrate is configured to include an opening on the back, the frequency of the total composite piezoelectric resonator can also be adjusted by cutting away the vibration portion from the back in order to reduce the thickness or by adding a film to the back of the vibration portion.

A third composite piezoelectric resonator according to preferred embodiments of the present invention includes a plurality of piezoelectric resonators including a substrate and a vibration portion provided on the substrate, the vibration portion having a structure in which the top and bottom surfaces of a thin film portion including at least one piezoelectric thin film are sandwiched between at least a pair of an upper electrode and a lower electrode facing each other, wherein the vibration portions of the plurality of piezoelectric resonators are covered with a protective film, and an additional electrode is provided on the upper electrode of a predetermined piezoelectric resonator with the above-described protective film being disposed therebetween.

According to the third composite piezoelectric resonator of preferred embodiments of the present invention, a reduction in thickness of the vibration portion of the piezoelectric resonator is achieved by performing a treatment in which upper electrodes of the plurality of piezoelectric resonators are etched, and in addition, since the vibration portions of the plurality of piezoelectric resonators are covered with a protective film, and the additional electrode is provided on the upper electrode of the predetermined piezoelectric resonator with the protective film therebetween, when individual vibration portions of the plurality of piezoelectric resonators are simultaneously etched, the degrees of reduction in thickness are different from each other. Therefore, the frequency of a specific resonator can be selectively adjusted. Furthermore, the desired frequency adjustment with respect to each vibration portion can be performed by one operation during the etching. In particular, when the substrate is configured to include an opening on the back, the frequency of the total composite piezoelectric resonator can also be adjusted by cutting away the vibration portion from the back in order to reduce the thickness or by adding a film to the back of the vibration portion.

In any one of the first to third composite piezoelectric resonators according to preferred embodiments of the present invention, preferably, the above-described piezoelectric thin film primarily includes ZnO or AlN.

In any one of the first to third composite piezoelectric resonators according to preferred embodiments of the present invention, preferably, the substrate has an opening or a concave portion, and the vibration portion is provided on the above-described opening or concave portion.

With respect to a first method for adjusting the frequency of a piezoelectric filter according to preferred embodiments of the present invention, the piezoelectric filter is provided with a plurality of piezoelectric resonators including a substrate and a vibration portion provided on the substrate, the vibration portion has a structure in which the top and bottom surfaces of a thin film portion including at least one piezoelectric thin film are sandwiched between at least a pair of an upper electrode and a lower electrode facing each other, and the upper electrode of a predetermined piezoelectric resonator is made of a material having susceptibility to etching that is different from that of the upper electrodes of the other piezoelectric resonators. The first method includes the step of adjusting the frequency of the above-described predetermined piezoelectric resonator by etching of the upper electrode of the predetermined piezoelectric resonator.

According to the first method for adjusting the frequency of a piezoelectric filter of preferred embodiments of the present invention, the reduction in thickness of the vibration portions of the plurality of piezoelectric resonators is achieved by performing a treatment in which upper electrodes of the plurality of piezoelectric resonators are etched, and in addition, since the susceptibility to etching of the upper electrode of the predetermined piezoelectric resonator is different from that of the upper electrodes of the other piezoelectric resonators, when individual vibration portions of the plurality of piezoelectric resonators are simultaneously etched, the degrees of reduction in thickness are different from each other. Therefore, the frequency of a specific resonator can be selectively adjusted. Furthermore, the desired frequency adjustment with respect to each piezoelectric resonator can be performed by one operation during the etching.

With respect to a second method for adjusting the frequency of a piezoelectric filter according to preferred embodiments of the present invention, the piezoelectric filter is provided with a plurality of piezoelectric resonators including a substrate and a vibration portion provided on the substrate, the vibration portion has a structure in which the top and bottom surfaces of a thin film portion including at least one piezoelectric thin film are sandwiched between at least a pair of an upper electrode and a lower electrode facing each other, an additional film is provided on the upper electrode of a predetermined piezoelectric resonator, and the additional film has susceptibility to etching different from that of the material for the upper electrode. The second method includes the step of adjusting the frequency of the predetermined piezoelectric resonator by etching of the additional film.

According to the second method for adjusting the frequency of a piezoelectric filter of preferred embodiments of the present invention, the reduction in thickness of the vibration portions of the plurality of piezoelectric resonators is achieved by performing a treatment in which upper electrodes of the plurality of piezoelectric resonators are etched, and in addition, since the additional film is provided on the upper electrode of the predetermined piezoelectric resonator, and the additional film has susceptibility to etching that is different from that of the materials for the upper electrode, when individual vibration portions of the plurality of piezoelectric resonators are simultaneously etched, the degrees of reduction in thickness are different from each other. Therefore, the frequency of a specific resonator can be selectively adjusted. Furthermore, the desired frequency adjustment with respect to each piezoelectric resonator can be performed by one operation during the etching.

With respect to a third method for adjusting the frequency of a piezoelectric filter according to preferred embodiments of the present invention, the piezoelectric filter includes a plurality of piezoelectric resonators including a substrate and a vibration portion provided on the substrate, the vibration portion has a structure in which the top and bottom surfaces of a thin film portion including at least one piezoelectric thin film are sandwiched between at least a pair of an upper electrode and a lower electrode facing each other, the vibration portions of the plurality of piezoelectric resonators are covered with a protective film, and an additional electrode is provided on the upper electrode of a predetermined piezoelectric resonator with the protective film being disposed therebetween. The third method includes the step of adjusting the frequency of the predetermined piezoelectric resonator by etching of the additional electrode.

According to the third method for adjusting the frequency of a piezoelectric filter of preferred embodiments of the present invention, the reduction in thickness of the vibration portions of the plurality of piezoelectric resonators is achieved by performing a treatment in which upper electrodes of the plurality of piezoelectric resonators are etched, and in addition, since the vibration portions of the plurality of piezoelectric resonators are covered with a protective film, and the additional electrode is provided on the upper electrode of the predetermined piezoelectric resonator with the protective film therebetween, when individual vibration portions of the plurality of piezoelectric resonators are simultaneously etched, the degrees of reduction in thickness are different from each other. Therefore, the frequency of a specific resonator can be selectively adjusted. Furthermore, the desired frequency adjustment with respect to each piezoelectric resonator can be performed by one operation during the etching.

Preferably, any one of the first to third methods for adjusting the frequency of a piezoelectric filter according to preferred embodiments of the present invention further includes the step of adjusting the frequency of the plurality of piezoelectric resonator by addition of a film to a vibration portion, or by etching of the vibration portion, through an opening, while the substrate has the opening and the vibration portion is provided on the opening. In this case, the frequency adjustment of the total piezoelectric filter can also be performed by cutting away the vibration portion of the plurality of piezoelectric resonators from the back through the opening in order to reduce the thickness or by adding a film to the vibration portions of the plurality of piezoelectric resonators from the back through the opening. Two frequency adjustments may be simultaneously performed, or be sequentially performed. At that time, these are performed in no particular order.

With respect to a fourth method for adjusting the frequency of a piezoelectric filter according to preferred embodiments of the present invention, the piezoelectric filter includes a plurality of piezoelectric resonators including a piezoelectric substrate and a vibration portion having a structure in which the piezoelectric substrate is sandwiched between at least a pair of an upper electrode and a lower electrode facing each other, the upper electrode of a predetermined piezoelectric resonator is made of a material having susceptibility to etching that is different from that of the upper electrodes of the other piezoelectric resonators. The fourth method includes the step of adjusting the frequency of the predetermined piezoelectric resonator by etching of the upper electrode of the predetermined piezoelectric resonator.

According to the fourth method for adjusting the frequency of a piezoelectric filter of preferred embodiments of the present invention, the reduction in thickness of the vibration portions of the plurality of piezoelectric resonators is achieved by performing a treatment in which upper electrodes of the plurality of piezoelectric resonators are etched, and in addition, since the susceptibility to etching of the upper electrode of the predetermined piezoelectric resonator is different from that of the upper electrodes of the other piezoelectric resonators, when individual vibration portions of the plurality of piezoelectric resonators are simultaneously etched, the degrees of reduction in thickness are different from each other. Therefore, the frequency of a specific resonator can be selectively adjusted. Furthermore, the desired frequency adjustment with respect to each piezoelectric resonator can be performed by one operation during the etching of the upper electrodes.

With respect to a fifth method for adjusting the frequency of a piezoelectric filter according to preferred embodiments of the present invention, the piezoelectric filter is provided with a plurality of piezoelectric resonators including a piezoelectric substrate and a vibration portion having a structure in which the piezoelectric substrate is sandwiched between at least a pair of an upper electrode and a lower electrode facing each other, an additional film is provided on the upper electrode of a predetermined piezoelectric resonator, and the additional film has susceptibility to etching that is different from that of the material for the upper electrode. The fifth method includes the step of adjusting the frequency of the predetermined piezoelectric resonator by etching of the above-described additional film.

According to the fifth method for adjusting the frequency of a piezoelectric filter of preferred embodiments of the present invention, the reduction in thickness of the vibration portions of the plurality of piezoelectric resonators is achieved by performing a treatment in which upper electrodes of the plurality of piezoelectric resonators are etched, and in addition, since the additional film is provided on the upper electrode of the predetermined piezoelectric resonator, and the additional film has susceptibility to etching that is different from that of the material for the upper electrode, when individual vibration portions of the plurality of piezoelectric resonators are simultaneously etched, the degrees of reduction in thickness are different from each other. Therefore, the frequency of a specific resonator can be selectively adjusted. Furthermore, the desired frequency adjustment with respect to each of the plurality of piezoelectric resonators can be performed by one operation during the etching of the upper electrodes.

Preferably, the fourth or fifth method for adjusting the frequency of a piezoelectric filter according to preferred embodiments of the present invention further includes the step of adjusting the frequency of the vibration portions by etching of a lower electrode of at least one of the plurality of piezoelectric resonators, while the lower electrode is made of a material having susceptibility to etching that is different from that of the lower electrodes of the other piezoelectric resonators. In this case, the frequency adjustment can be performed by the etching of not only the upper electrodes, but also the lower electrodes in a manner similar to that in the upper electrodes. Consequently, with respect to both the upper electrodes and the lower electrodes, the materials of the surfaces to be etched are adjusted to have different susceptibility to etching, and therefore, it is possible to adjust the frequency of a specific resonator or a specific group of resonators by etching of the upper electrodes, and to adjust the frequencies of the other resonators or the other groups of resonators by etching of the lower electrodes, so that the frequency can be selectively adjusted on a vibration portion of the piezoelectric resonator basis.

Preferably, the fourth or fifth method for adjusting the frequency of a piezoelectric filter according to preferred embodiments of the present invention further includes the step of adjusting the frequency of the predetermined piezoelectric resonator by etching of an additional film provided on a lower electrode of at least one of the plurality of piezoelectric resonators, after the frequency of the above-described upper electrode is adjusted, while the additional film has susceptibility to etching different from that of the materials for the lower electrodes of the other piezoelectric resonators.

Preferably, the fourth or fifth method for adjusting the frequency of a piezoelectric filter according to preferred embodiments of the present invention further includes the step of adjusting the frequency of the predetermined piezoelectric resonator by etching of a lower electrode after the frequency of the upper electrode is adjusted, while the lower electrode is shared among at least a portion of the plurality of piezoelectric resonators. In this case, since at least a portion of the lower electrodes are shared, the frequencies of some specific resonators as well as the other resonators can be adjusted by one operation.

According to the piezoelectric filter of preferred embodiments of the present invention, when individual vibration portions of the plurality of piezoelectric resonators are simultaneously etched, the degrees of reduction in thickness are different from each other. Therefore, the frequency of a specific resonator can be selectively adjusted. Furthermore, the desired frequency adjustment with respect to each vibration portion can be performed by one operation during the etching. In particular, when the substrate is configured to include an opening on the back, the frequency of the total piezoelectric filter can also be adjusted by cutting away the vibration portion from the back in order to reduce the thickness or by adding a film to the back of the vibration portion.

In particular, with respect to the ladder piezoelectric filter according to preferred embodiments of the present invention, the etching retardant film is formed on the upper electrode of one of the series piezoelectric resonator and the parallel piezoelectric resonator, while the etching retardant film has susceptibility to etching lower than that of the upper electrode material under the same condition. That is, the degree of change in frequency due to etching of the series piezoelectric resonator is differentiated from that of the parallel piezoelectric resonator. In this manner, the difference in resonant frequency between the series piezoelectric resonator and the parallel piezoelectric resonator is adjusted by etching of the upper electrode without using a mask and the like, and therefore, the pass band width of the piezoelectric filter can be adjusted to a desired value. In particular, with respect to the piezoelectric filter in which the substrate having the opening is provided and the vibration portions of the piezoelectric resonators are provided on the opening, after the pass band width of the piezoelectric filter is adjusted to a desired value by etching of the upper electrode, the total piezoelectric filter can be adjusted by etching of the thin film provided to block the opening or by addition of the adjusting film to the thin film, each performed from the opening side.

With respect to the ladder piezoelectric filter according to a preferred embodiment of the present invention, the upper electrode of the series piezoelectric resonator and the upper electrode of the parallel piezoelectric resonator are formed from materials having different susceptibility to etching under the same condition. That is, the degree of change in frequency due to etching of the series piezoelectric resonator is differentiated from that of the parallel piezoelectric resonator. In this manner, the difference in resonant frequency between the series piezoelectric resonator and the parallel piezoelectric resonator is adjusted by etching of the upper electrode without using a mask and the like, and therefore, the pass band width of the piezoelectric filter can be adjusted to a desired value. In particular, with respect to the piezoelectric filter in which the substrate having the opening is provided and the vibration portions of the piezoelectric resonators are provided on the opening, after the pass band width of the piezoelectric filter is adjusted to a desired value by etching of the upper electrode, the total piezoelectric filter can be adjusted by etching of the thin film provided to block the opening or by addition of the adjusting film to the thin film, each performed from the opening side.

With respect to the ladder piezoelectric filter according to preferred embodiments of the present invention, the vibration portions of both the series piezoelectric resonator and the parallel piezoelectric resonator are covered with the protective film, and furthermore, the additional electrode having a different etching rate from that of the protective film under the same condition is provided on one of the upper electrodes of the series piezoelectric resonator and the parallel piezoelectric resonator with the protective film being disposed therebetween. That is, the degree of change in frequency due to etching of the series piezoelectric resonator is differentiated from that of the parallel piezoelectric resonator. In this manner, the difference in resonant frequency between the series piezoelectric resonator and the parallel piezoelectric resonator is adjusted by etching of the upper electrode without using a mask and the like, and therefore, the pass band width of the piezoelectric filter can be adjusted to a desired value. In particular, with respect to the piezoelectric filter in which the substrate having the opening is provided and the vibration portions of the piezoelectric resonators are provided on the opening, after the pass band width of the piezoelectric filter is adjusted to a desired value by etching of the upper electrode, the total piezoelectric filter can be adjusted by etching of the thin film provided to block the opening or by addition of the adjusting film to the thin film, each performed from the opening side.

With respect to the piezoelectric resonator having a configuration in which the piezoelectric substrate is sandwiched between the upper electrodes and the lower electrodes facing each other, and therefore, a plurality of vibration portions are included, materials for the outermost surfaces of both the upper and lower electrodes are adjusted to be the materials having different susceptibility to etching such that the thickness of the vibration portions can be adjusted. Consequently, the frequency of a specific vibration portion or a specific group of vibration portions can be adjusted by etching of the upper electrode, and the frequency of the other vibration portions or the other specific groups of vibration portions can be adjusted by etching of the lower electrode. In this case, when a lower electrode is shared, the frequencies of a specific vibration portion and the vibration portions other than the specific vibration portion can be adjusted by one operation through the frequency adjustment of the lower electrode.

Consequently, an improvement in efficiency of the frequency adjustment operation can be achieved.

Other features, elements, characteristics and advantages of the present invention will become more apparent from the following detailed description of preferred embodiments with reference to the attached drawings.

DETAILED DESCRIPTION OF PREFERRED EMBODIMENTS

Figure 1:
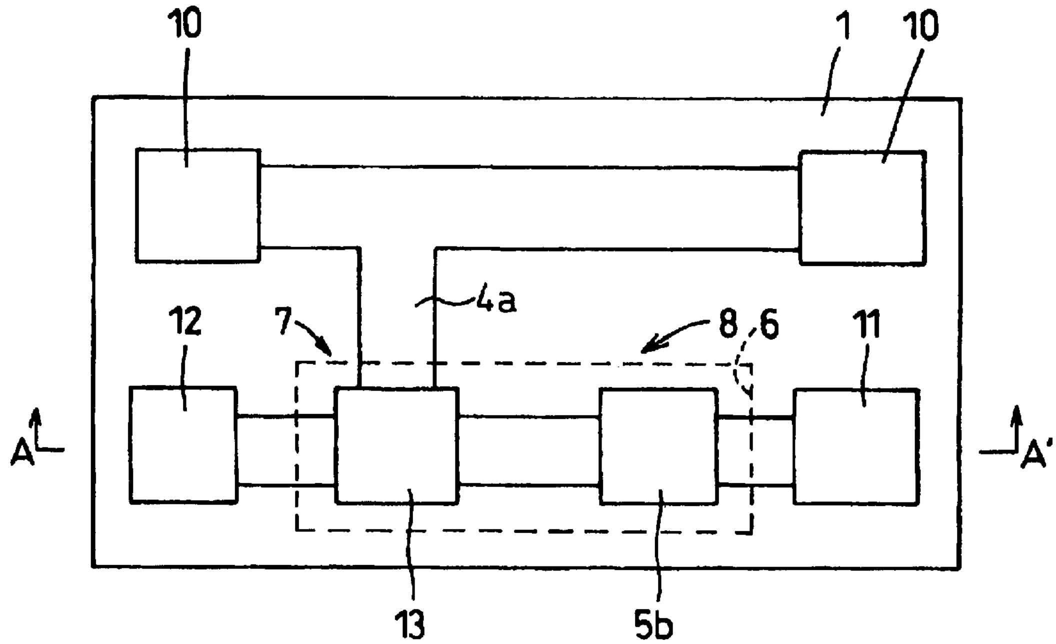
FIG. 1 is a plan view showing a preferred embodiment of a piezoelectric filter according to the present invention.

The present invention will be described below in detail with reference to preferred embodiments shown in the drawings.

First Preferred Embodiment

Figure 2:
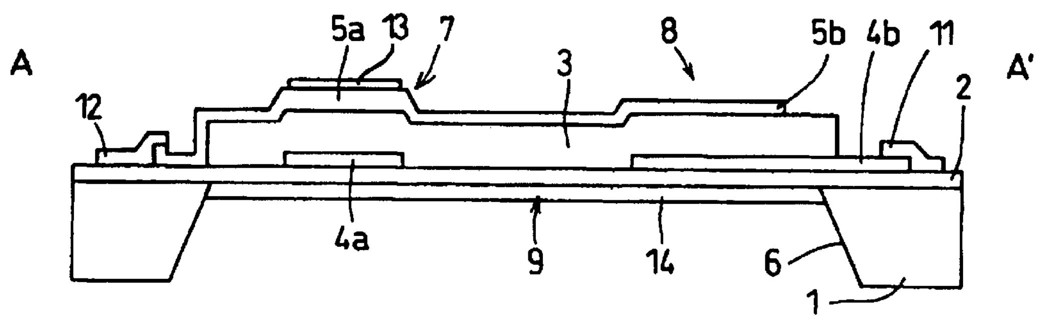
FIG. 2 is a sectional view of a section of the piezoelectric filter, taken along a line A–A' shown in FIG. 1.
Figure 3:
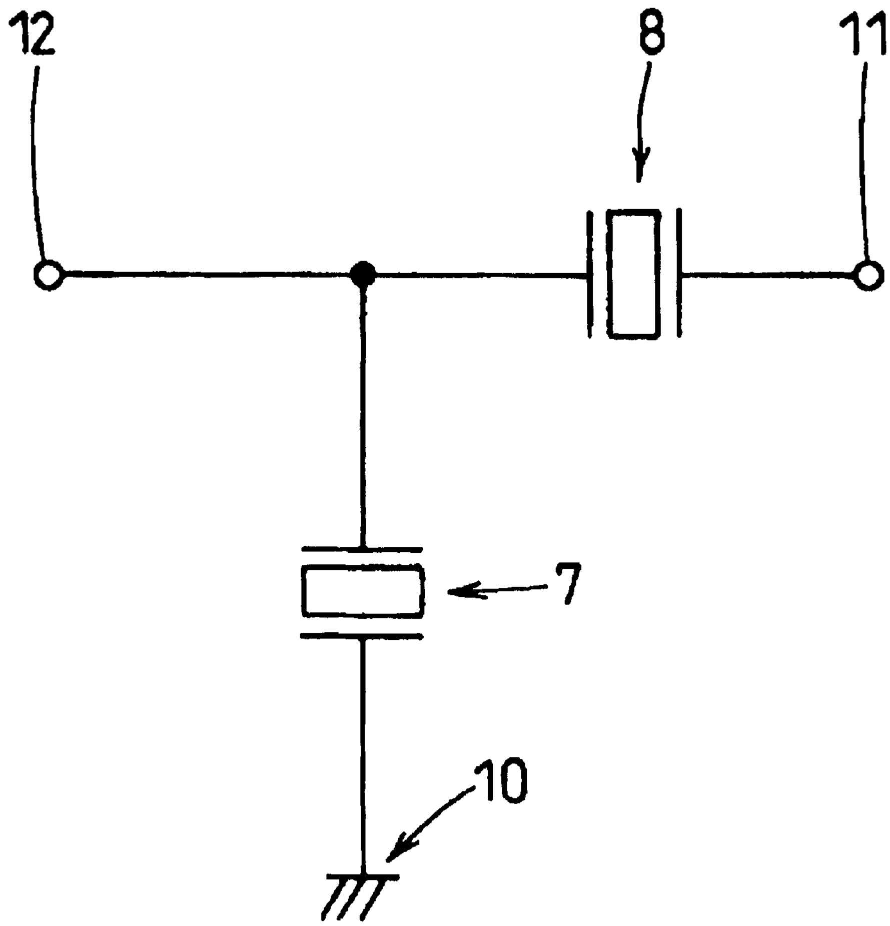
FIG. 3 is a circuit diagram of the piezoelectric filter shown in FIG. 1.
Figure 4A:
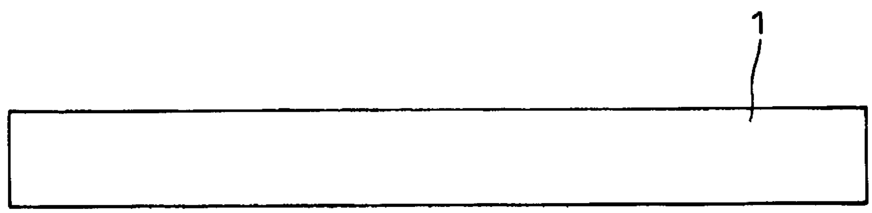
FIGS. 4A to 4D are vertical, sectional side views showing manufacturing steps of the piezoelectric filter shown in FIG. 1.
Figure 4B:
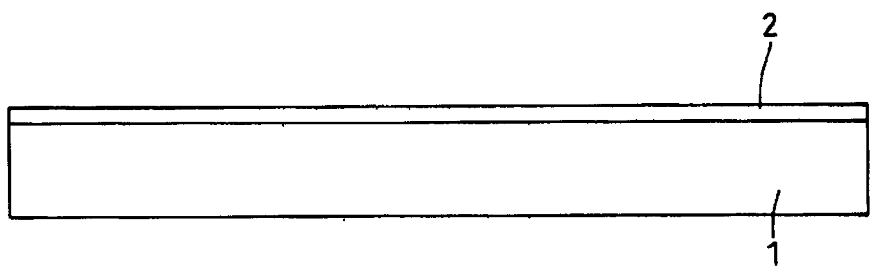
Figure 4C:
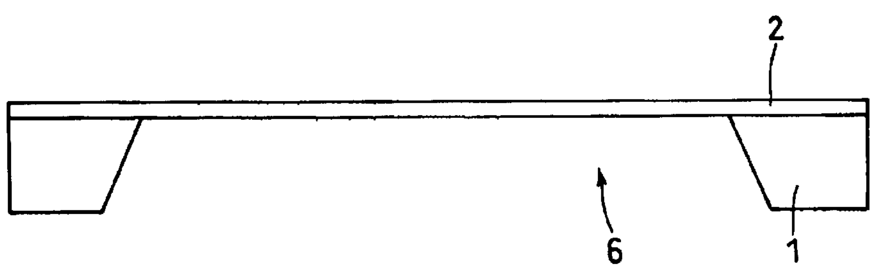
Figure 4D:
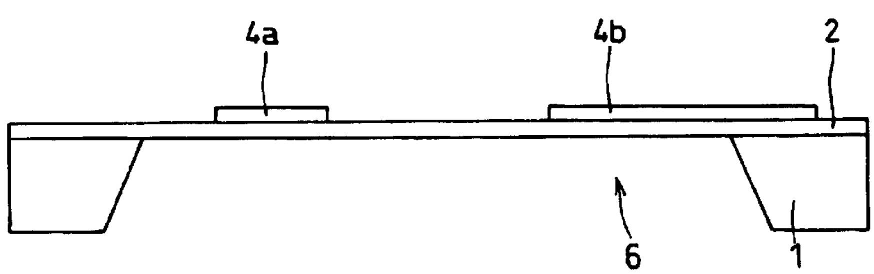
Figure 5E:
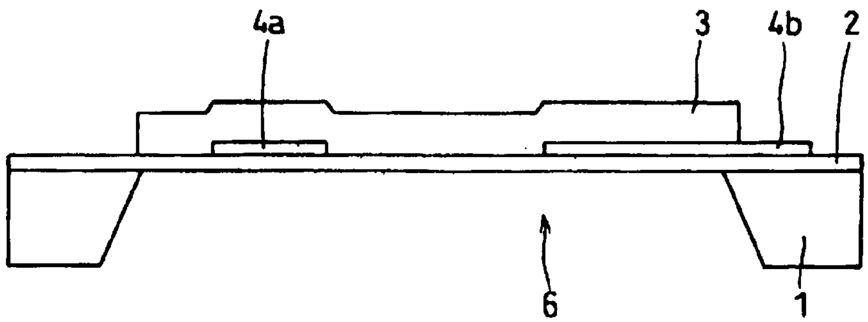
FIGS. 5E to 5H are vertical, sectional side views showing manufacturing steps of the piezoelectric filter, following FIG. 4D.
Figure 5F:
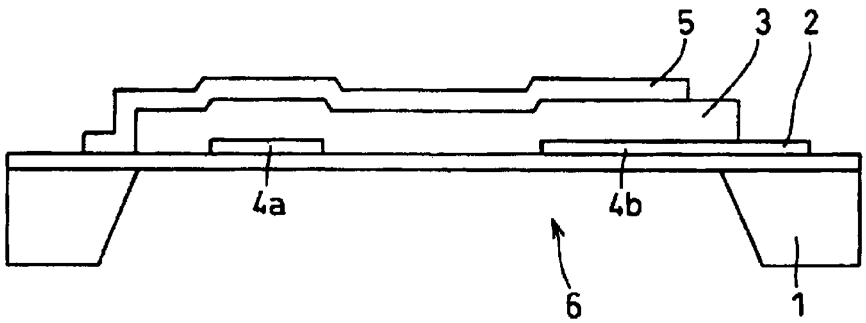
Figure 5G:
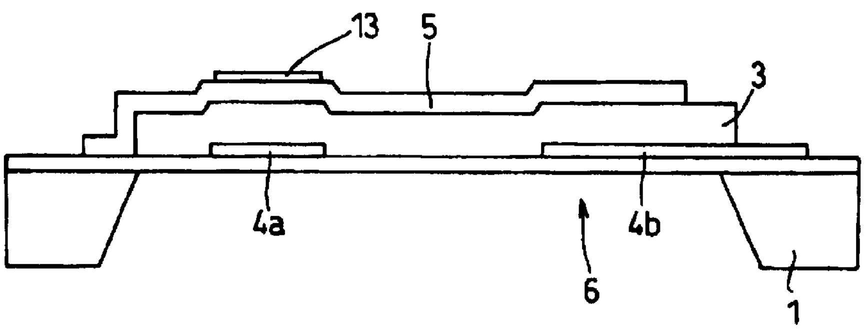
Figure 5H:
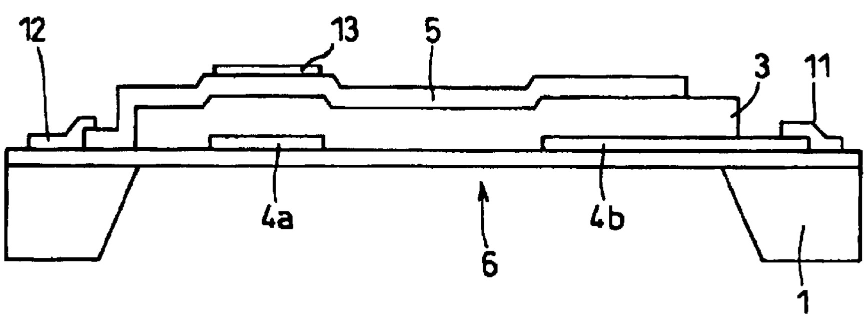
Figure 6:
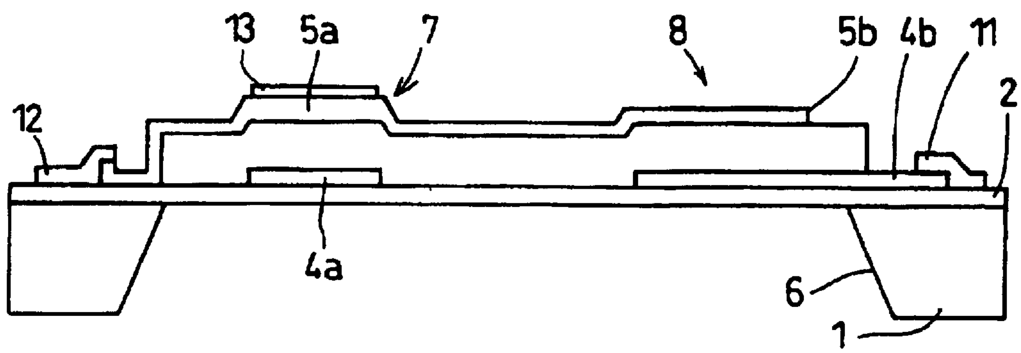
FIG. 6 is a vertical, sectional side view showing a manufacturing step of the piezoelectric filter, following FIG. 5H, and showing the state after the frequency of one vibration portion is adjusted.

FIG. 1 to FIG. 6 show a preferred embodiment according to the present invention. FIG. 1 is a plan view of an L type ladder filter. FIG. 2 is a sectional view of a section taken along a line A–A' shown in FIG. 1. FIG. 3 is a circuit diagram of the L type ladder filter shown in FIG. 1. FIGS. 4A to 4D and FIGS. 5E to 5H are sectional views of a key portion, showing manufacturing steps of the L type ladder filter shown in FIG. 1. FIG. 6 is a vertical, sectional view showing a state after a predetermined vibration portion surface is etched.

A piezoelectric filter configured as an L type ladder filter is shown in FIG. 1 to FIG. 3. Reference numeral 1 denotes a silicon substrate that is susceptible to anisotropic etching, reference numeral 2 denotes a thin film made of silicon oxide ($SiO_2$), reference numeral 3 denotes a piezoelectric thin film composed of a thin film layer primarily containing zinc oxide (ZnO), reference numerals 4*a* and 4*b* denote lower electrodes made of aluminum (Al) or other suitable material and reference numerals 5*a* and 5*b* denote upper electrodes also made of aluminum (Al) or other suitable material.

The substrate 1 is preferably made of a silicon wafer. This substrate 1 is provided with an opening 6 to become a vertically penetrating through hole. This opening 6 ensures a vibration space of a parallel piezoelectric resonator 7 and a series piezoelectric resonator 8 having vibration portions including a piezoelectric thin film 3, lower electrodes 4*a* and 4*b* and upper electrodes 5*a* and 5*b*. The thin film 2 is provided in the state of covering all over the opening 6. The thin film 2 is a diaphragm 9 as a support portion for supporting the parallel piezoelectric resonator 7 and the series piezoelectric resonator 8.

The lower electrodes 4*a* and 4*b* are individually provided on the diaphragm 9. The lower electrode 4*a* is connected to a GND electrode 10. The lower electrode 4*b* is connected to an output electrode 11. The piezoelectric thin film 3 constituting at least one layer primarily including zinc oxide (ZnO) is provided as a thin film portion on the lower electrodes 4*a* and 4*b*. The upper electrode 5*a* is provided in order that the piezoelectric thin film 3 is vertically sandwiched between the upper electrode 5*a* and the lower electrode 4*a* in the region of the diaphragm 9 while a portion of the upper electrode 5*a* faces the lower electrode 4*a* in the vertical direction. The upper electrode 5*b* is provided in order that the piezoelectric thin film 3 is vertically sandwiched between the upper electrode 5*b* and the lower electrode 4*b* in the region of the diaphragm 9 while a portion of the upper electrode 5*b* faces the lower electrode 4*b* in the vertical direction. These upper electrodes 5*a* and 5*b* are formed in the same manner as the thin film layer, and the thicknesses of the electrodes 5*a* and 5*b* are differentiated from each other, as described below. Both the upper electrodes 5*a* and 5*b* are connected to an input electrode 12.

The lower electrode 4*a* and the upper electrode 5*a* vertically overlap one another to take the shape of an approximate rectangle when viewed from the overlapping direction. Likewise, the lower electrode 4*b* and the upper electrode 5*b* vertically overlap one another to take the shape of an approximate rectangle when viewed from the overlapping direction. The parallel piezoelectric resonator 7 is configured to have a vibration portion including the lower electrode 4*a*, the upper electrode 5*a* and a portion of the piezoelectric thin film 3 vertically sandwiched therebetween. The series piezoelectric resonator 8 is configured to have a vibration portion including the lower electrode 4*b*, the upper electrode 5*b* and a portion of the piezoelectric thin film 3 vertically sandwiched therebetween. Electric signals are applied to these vibration portions via the lower electrodes 4*a* and 4*b* and the upper electrodes 5*a* and 5*b*, and thereby, these vibration portions individually create the thickness longitudinal vibration so as to perform functions as piezoelectric resonators. The vibration mode of the vibration portion may be the thickness shear vibration.

The upper electrode 5*a* and the upper electrode 5*b* are integrally provided as one electrode film, as described below. The upper electrode 5*b* is etched to have a thickness that is smaller than that of the upper electrode 5*a*. The reason for processing to have such a reduced thickness is that in particular, the upper electrode 5*b* is selectively etched in order to adjust the setting of the resonant frequency. Consequently, an etching retardant film 13 made of alumina ($Al_2O_3$) or other suitable material is provided as a surface portion layer on the surface of the upper electrode 5*a* as an electrode layer. Alumina is less susceptible to etching compared with Al which is the material for upper electrodes 5*a* and 5*b* under the same condition.

For details, the resonant frequency of the piezoelectric resonator is determined based on the thickness of the vibration portion including the thin film 2, the piezoelectric thin film 3, the lower electrodes 4*a* and 4*b*, the upper electrodes 5*a* and 5*b* and the etching retardant film 13. In the ladder piezoelectric filter, the pass band width is determined based on the difference in the resonant frequency between the series piezoelectric resonator and the parallel piezoelectric resonator. When etching for adjusting the frequencies of the parallel piezoelectric resonator 7 and the series piezoelectric resonator 8 is performed from above the parallel piezoelectric resonator 7 and the series piezoelectric resonator 8 in the condition in which the etching retardant film 13 made of alumina ($Al_2O_3$) or other suitable material is provided as the surface portion layer on the surface of the upper electrode 5*a*, as in the present preferred embodiment, while alumina has susceptibility to etching lower than that of Al which is the material used for upper electrodes 5*a* and 5*b*, the etching retardant film 13 having low susceptibility to etching is hardly etched. On the other hand, the upper electrode 5*b* is etched, and thereby, the thickness of the upper electrode 5*b* becomes smaller than that of the upper electrode 5*a*. That is, the thickness of the vibration portion of the series piezoelectric resonator 8 is made smaller than that of the vibration portion of the parallel piezoelectric resonator 7. As a result, the difference in resonant frequency between the series piezoelectric resonator and the parallel piezoelectric resonator is varied, and the pass band width can be adjusted to a desired value.

In this manner, in the present preferred embodiment, the etching retardant film 13 made of a material having susceptibility to etching that is lower than that of the upper electrodes 5*a* and 5*b*, under the same condition, is provided on the surface of the upper electrode 5*a*, the etching proceeding rate in the parallel piezoelectric resonator 7 is differentiated from that in the series piezoelectric resonator 8, and thereby, the difference in resonant frequency between the series piezoelectric resonator and the parallel piezoelectric resonator is adjusted, and the pass band width is adjusted to a desired value.

As described above, the etching for adjusting the frequencies of the parallel piezoelectric resonator 7 and the series piezoelectric resonator 8 is performed from above the parallel piezoelectric resonator 7 and the series piezoelectric resonator 8, so that the difference between the thicknesses of the vibration portions of the parallel piezoelectric resonator 7 and the series piezoelectric resonator 8 is adjusted, and thereby, the pass band width is adjusted to a desired value. Subsequently, an adjusting film 14 is additionally provided on the bottom side of the thin film 2, so that the frequency of the total piezoelectric filter is adjusted. The frequency of the total piezoelectric filter is varied depending on the thickness of the adjusting film 14 added, and the frequency of the total piezoelectric filter is lowered with an increase in thickness of the adjusting film 14. In order to increase the frequency of the total piezoelectric filter, the thin film 2 is etched from the bottom side, and the adjustment is performed by reducing the thickness of the thin film 2.

A method for manufacturing this piezoelectric filter will be described below with reference to FIGS. 4A to 4D and FIGS. 5E to 5H showing the sectional views of specified steps. As shown in FIG. 4A, the substrate 1 in the state of silicon wafer is prepared. As shown in FIG. 4B, the thin film 2 made of silicon oxide ($SiO_2$) is formed on one surface (put another way, the top surface) of the substrate 1. This thin film 2 is formed onto the surface of the substrate 1 by a sputtering method, a CVD method or other suitable process.

As shown in FIG. 4C, a hollow-shaped opening 6 is formed from the other surface (put another way, the bottom surface) of the substrate 1 up to the thin film 2. The opening 6 is provided by anisotropic etching, reactive etching, processing with a laser or other suitable process, as necessary. In FIG. 1, the outline of the opening 6 viewed from the surface side of the substrate 1 is indicated by a broken line.

As shown in FIG. 4D, an electrode film is formed all over the thin film 2 from aluminum (Al) or other suitable material as a material by vacuum evaporation, sputtering or other suitable process, while necessary regions on the surface of the thin film 2 are protected by a patterned resist film, although not shown in the drawing. Subsequently, the resist film is peeled off, and therefore, each of the lower electrodes 4*a* and 4*b* is formed. Au, Pt, Nb, W, Cu, Ag or other suitable material may be used for the lower electrodes 4*a* and 4*b* instead of Al.

As shown in FIG. 5E, a piezoelectric thin film 3 primarily including zinc oxide (ZnO) is formed by vacuum evaporation, sputtering or other suitable process while masking is performed with a metal mask or the like, although not shown in the drawing.

Figure 24:
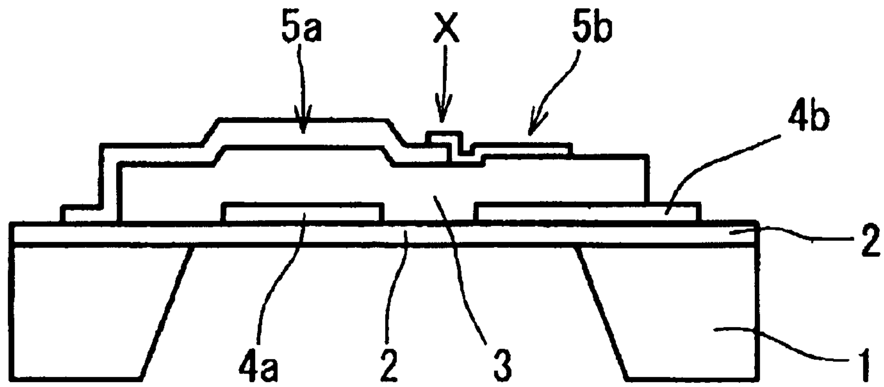
FIG. 24 is a vertical, sectional side view showing another preferred embodiment of a piezoelectric filter according to the present invention.

As shown in FIG. 5F, an upper electrode pattern is formed with a resist film not shown in the drawing, and an aluminum (Al) film is formed over the entire surface. Subsequently, the resist film is peeled off, so that an upper electrode portion 5 for forming the upper electrodes 5*a* and 5*b* is formed. The upper electrode 5*a* and 5*b* may be separately formed in order that the upper electrodes 5*a* and 5*b* have the predetermined required thicknesses, as shown in FIG. 24. In this case, the upper electrode 5*a* and the upper electrode 5*b* are electrically connected at x where no influence is exerted on the vibration.

As shown in FIG. 5G, in order that etching of the upper electrode 5*a* is reduced, the etching retardant film 13 as an additional film made of alumina ($Al_2O_3$) is formed on the top surface of the upper electrode 5*a* by vacuum evaporation, sputtering or other process while masking is performed with a metal mask or the like, although not shown in the drawing.

As shown in FIG. 5H, films of a pad portion of the input electrode 12 connected to the upper electrode 5*a*, a pad portion of the output electrode 11 connected to the lower electrode 4*b* and a pad portion of the GND electrode 10 are formed. The GND electrode 10, the output electrode 11 and the input electrode 12 may be simultaneously formed during film formation of the electrodes. A piezoelectric filter in the condition antecedent to the frequency adjustment is produced through the steps up to this point.

The frequency adjustment of this piezoelectric filter will be described. With respect to the series piezoelectric resonator 8, processing for reducing the thickness thereof is performed, and thereby, the resonant frequency of the series piezoelectric resonator 8 is adjusted to become close to the desired frequency. A measurement apparatus, e.g. a high-frequency network analyzer, may be used for this adjustment. In this case, a frequency signal from the high-frequency network analyzer is input between the input electrode 12 and the GND electrode 10, and thereby, a signal is output between the output electrode 11 and the GND electrode 10 in response to the input signal. The center frequency and the pass band width of a filter including the parallel piezoelectric resonator 7 and the series piezoelectric resonator 8 are measured with the high-frequency network analyzer.

With respect to the pass band width, the amount of deviation from the desired value of the pass band width required of the piezoelectric filter is determined based on this measurement result. The ion milling time $t_1$ required for adjusting the frequency to achieve a desired pass band width can be calculated based on the relationship between the ion milling time in terms of etching in an argon (Ar) atmosphere and the amount of decrease in the pass band width of a good piezoelectric filter, the relationship being experimentally determined in advance. With respect to the above-described center frequency measured, the evaporation time $t_2$ required for achieving the desired center frequency can be calculated based on the amount of deviation from the desired value of the center frequency and the relationship between the evaporation time for forming the adjusting film 14 made of silver (Ag) or other suitable material and the amount of decrease in the center frequency, the relationship being experimentally determined in advance. Numerical values of the ion milling rates in this argon atmosphere are specifically shown below. The ion milling rates are about 2.0 (nm/min) with respect to aluminum, about 10.0 (nm/min) with respect to gold and about 0.2 (nm/min) with respect to alumina ($Al_2O_3$).

The above-described piezoelectric filter is introduced into an ion milling apparatus, and the surface is etched in the argon atmosphere just for a time $t_1$ based on the above-described calculation result. With respect to the upper electrodes 5*a* and 5*b*, since the upper electrode 5*b* is more susceptible to etching compared with the upper electrode 5*a* provided with the etching retardant film 13, reduction in thickness of the upper electrode 5*b* is accelerated by this etching. Consequently, the resonant frequency of the series piezoelectric resonator 8 is adjusted to shift to the higher side. The difference in resonant frequency between the series piezoelectric resonator and the parallel piezoelectric resonator can be thereby adjusted, and the pass band width can be adjusted to a desired value. Subsequently, the resulting piezoelectric filter is introduced into an evaporation apparatus, silver (Ag) is evaporated onto the bottom surface of the diaphragm 9 just for a time $t_2$ to form the adjusting film 14, and thereby, the frequency of the total piezoelectric filter is adjusted. In this manner, both the pass band width and the center frequency of the piezoelectric filter are adjusted at desired values. An insulating film made of $SiO_2$ or other suitable material may be used in place of silver (Ag).

Through the above-described steps, the L type ladder filter having an adjusted frequency can be produced, as shown in FIG. 1. In this manner, the resonant frequencies of the series piezoelectric resonator and the parallel piezoelectric resonator constituting this piezoelectric filter can be simultaneously adjusted. When each vibration portion is individually adjusted, in some steps, a mask or the like is required for a vibration portion not targeted for the adjustment. However, such a step can be eliminated, and therefore, simplification of the adjustment steps can be achieved. The frequencies of a plurality of filter elements provided on the substrate can be adjusted by one operation.

As described above, in the present preferred embodiment, with respect to the ladder piezoelectric filter, the etching retardant film is formed on the upper electrode of one of the series piezoelectric resonator and the parallel piezoelectric resonator, while the etching retardant film has susceptibility to etching that is lower than that of the upper electrode material under the same condition. The degree of change in frequency due to etching of the series piezoelectric resonator is thereby differentiated from that of the parallel piezoelectric resonator. In this manner, the difference in resonant frequency between the series piezoelectric resonator and the parallel piezoelectric resonator is adjusted by etching of the upper electrode without using a mask and the like, and therefore, the pass band width of the piezoelectric filter can be adjusted to a desired value. In particular, with respect to the piezoelectric filter in which the substrate having the opening is provided, and the vibration portions of the piezoelectric resonators are provided on the opening, after the pass band width of the piezoelectric filter is adjusted to a desired value by etching of the upper electrode, the total piezoelectric filter can be adjusted by etching of the thin film provided to block the opening or by addition of the adjusting film to the thin film, each performed from the opening side. The frequency of the total filter may be adjusted as a first step, and thereafter, the frequency of each of the resonators in the series side and the parallel side may be adjusted.

In the first preferred embodiment, with respect to the parallel piezoelectric resonator 7 and the series piezoelectric resonator 8, preferably, the thicknesses of the piezoelectric thin film 3 and the lower electrodes 4*a* and 4*b* are equalized, and thereafter, the thicknesses of the upper electrodes 5*a* and 5*b* are differentiated from each other, so that the resonant frequencies of the parallel piezoelectric resonator 7 and the series piezoelectric resonator 8 are differentiated from each other. When such a structure is adopted, manufacture becomes easy, and in addition, the resonant frequencies of the parallel piezoelectric resonator 7 and the series piezoelectric resonator 8 can be adjusted simply by adjusting the thicknesses of the upper electrodes 5*a* and 5*b*.

Second Preferred Embodiment

Figure 7:
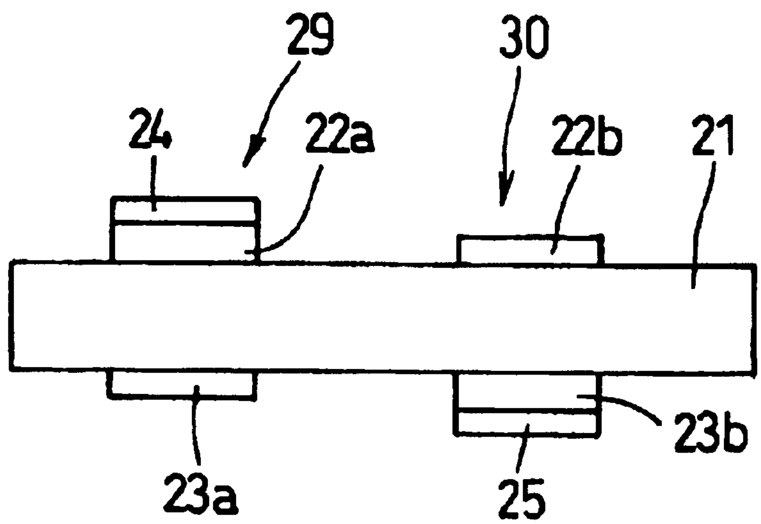
FIG. 7 is a vertical, sectional side view showing another preferred embodiment of a piezoelectric filter according to the present invention.
Figure 8A:
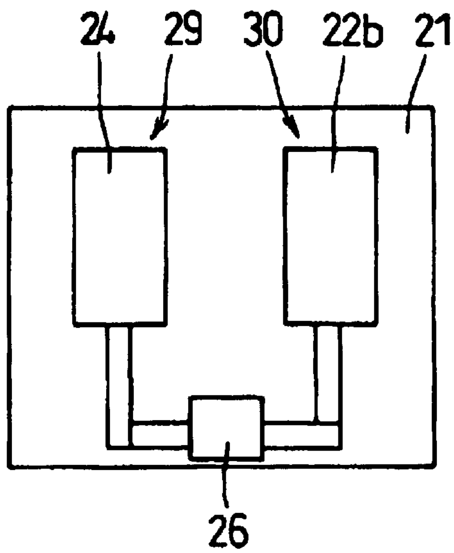
FIGS. 8A and 8B are a plan view and a bottom view, respectively, of the piezoelectric filter shown in FIG. 7.
Figure 8B:
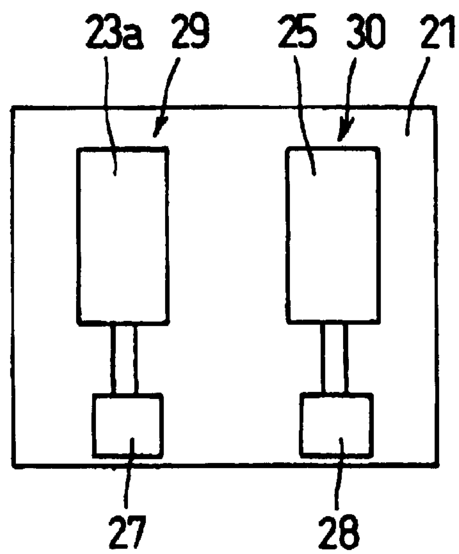
Figure 9:
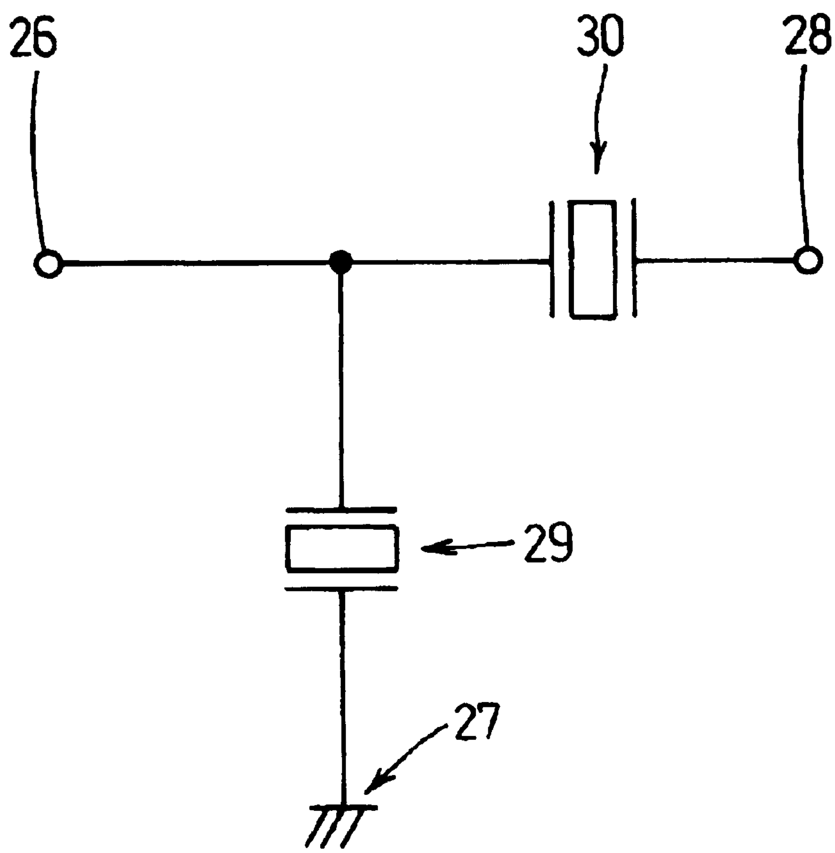
FIG. 9 is a circuit diagram of the piezoelectric filter shown in FIG. 7.
Figure 10A:
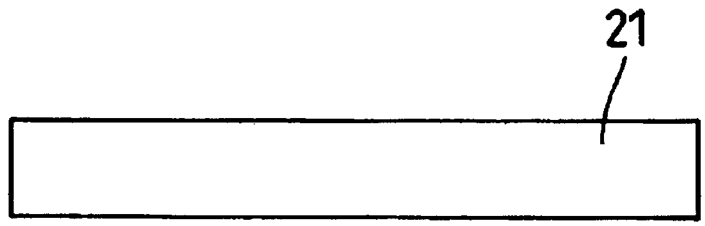
FIGS. 10A to 10C are vertical, sectional side views showing manufacturing steps of the piezoelectric filter shown in FIG. 7.
Figure 10B:
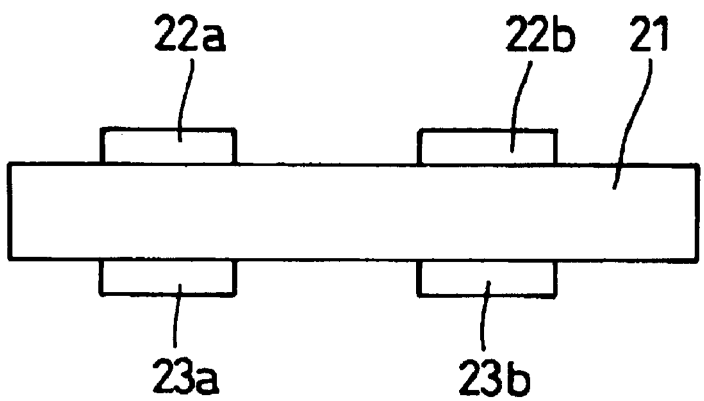
Figure 10C:
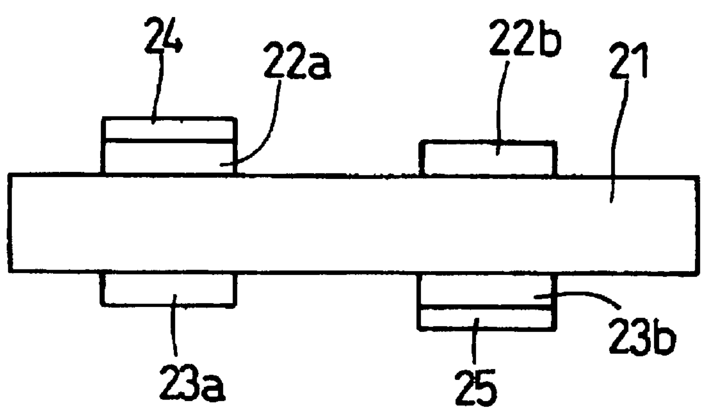

The second preferred embodiment of the piezoelectric filter according to the present invention will be described. FIG. 7 is a vertical, sectional view of the piezoelectric filter. FIGS. 8A and 8B are a plan view and a bottom view, respectively, of the piezoelectric filter shown in FIG. 7. FIG. 9 is a circuit diagram of the piezoelectric filter shown in FIG. 7. FIGS. 10A to 10C are sectional views of the key portion, illustrating manufacturing steps of the ladder filter shown in FIG. 7.

In FIG. 7, reference numeral 21 denotes a piezoelectric substrate including a thin-plate shaped piezoelectric material preferably formed from lithium tantalate ($LiTaO_3$), reference numerals 22*a* and 22*b* denote upper electrodes made of metal films provided at the respective predetermined positions on the top surface of the substrate 21, reference numerals 23*a* and 23*b* denote lower electrodes made of metal films provided at the respective predetermined positions on the bottom surface of the substrate 21, reference numeral 24 denotes an etching retardant film as an additional film further provided on the surface of the upper electrode 22*a*, and reference numeral 25 denotes an etching retardant film as an additional film further provided on the surface of the lower electrode 23*b*. For example, lithium niobate ($LiNbO_3$), quartz or other suitable material may be used for the substrate 21.

Both the top and bottom surfaces of the substrate 21 are mirror-finished. A pair of upper electrodes 22*a* and 22*b* are films provided at two respective predetermined positions on the top surface of this substrate 21. Each of the upper electrodes 22*a* and 22*b* preferably is configured in the shape of an approximate rectangle in the plan view. Both the upper electrodes 22*a* and 22*b* are preferably made of aluminum (Al). Both the upper electrodes 22*a* and 22*b* may be formed from a high conductivity material, e.g. gold (Au), in place of aluminum. An etching retardant film 24 made of alumina ($Al_2O_3$) or other suitable material is provided on the surface of one upper electrode 22*a*. Alumina has susceptibility to etching lower than that of aluminum under the same condition. The surface portion of the other upper electrode 22*b* remains in its state as formed from aluminum.

The lower electrodes 23*a* and 23*b* are films provided on the bottom surface of the substrate 21 at the positions facing the upper electrodes 22*a* and 22*b* respectively. The lower electrodes 23*a* and 23*b* have the shapes of approximate rectangles, in the plan view, in accordance with the respective shapes of the upper electrodes 22*a* and 22*b*. Both the lower electrodes 23*a* and 23*b* are preferably made of aluminum. Both the lower electrodes 23*a* and 23*b* may be formed from a high conductivity material, e.g. gold (Au), in place of aluminum. An etching retardant film 25 made of alumina ($Al_2O_3$) or other suitable material is provided on the surface of one lower electrode 23*b*. Alumina has a susceptibility to etching that is lower than that of aluminum under the same condition. The surface portion of the other lower electrode 23*a* remains in its state as formed from aluminum.

A lead electrode 26 connected to both the upper electrodes 22*a* and 22*b* is provided as an input electrode on the top surface of the substrate 21. A lead electrode 27 connected to the lower electrode 23*a* is provided as a GND electrode on the bottom surface of the substrate 21. A lead electrode 28 connected to the lower electrode 23*b* is provided as an output electrode on the bottom surface of the substrate 21.

Here, the parallel piezoelectric resonator 29 is configured to have a vibration portion including the lower electrode 23*a*, the upper electrode 22*a* and a portion of the substrate 21 vertically sandwiched therebetween. The series piezoelectric resonator 30 is configured to have a vibration portion including the lower electrode 23*b*, the upper electrode 22*b* and a portion of the substrate 21 vertically sandwiched therebetween. In this manner, an L type ladder piezoelectric filter shown in FIG. 9 is configured.

A method for manufacturing this piezoelectric filter will be described below with reference to FIGS. 10A to 10C showing the sectional views of specified steps. As shown in FIG. 10A, the substrate 21 preferably made lithium tantalate ($LiTaO_3$) in the shape of a thin plate with both surfaces mirror-finished is prepared. As shown in FIG. 10B, electrode films are formed all over the substrate 21 from aluminum (Al) or other suitable material as a material by vacuum evaporation, sputtering or other suitable process, while necessary regions on both surfaces of the substrate 21 are individually protected by patterned resist films, although not shown in the drawing. Subsequently, the resist films are peeled off, and therefore, each of the upper electrodes 22*a* and 22*b* and the lower electrodes 23*a* and 23*b* is formed.

As shown in FIG. 10C, etching retardant films 24 and 25 made of alumina ($Al_2O_3$) are formed in accordance with the portions on which the upper electrode 22*a* and the lower electrode 23*b* are provided, by vacuum evaporation, sputtering or other suitable process while masking is performed with a metal mask or the like, although not shown in the drawing.

Films of lead electrodes 26, 27 and 28 and the like are formed on the substrate 21. The lead electrodes 26, 27 and 28 may be integrally formed with the upper electrodes 22*a* and 22*b* and the lower electrodes 23*a* and 23*b*. A piezoelectric filter in the condition antecedent to the frequency adjustment is produced through the steps up to this point.

The frequency adjustment of this piezoelectric filter will be described. With respect to each of the parallel piezoelectric resonator 29 and the series piezoelectric resonator 30, processing for reducing the thickness thereof is individually performed, and thereby, the resonant frequency of each of the resonators 29 and 30 is adjusted at the desired frequency. A measurement apparatus, e.g. a high-frequency network analyzer, is used for this adjustment. A frequency signal from the high-frequency network analyzer is input between the lead electrode 26 and the lead electrode 27, and thereby, the vibration portion located therebetween is excited. The resonant frequency of the parallel piezoelectric resonator 29 is measured based on the reflection characteristic at that time. Likewise, a signal is input between the lead electrode 26 and the lead electrode 28, and the resonant frequency of the series piezoelectric resonator 30 is measured based on the reflection characteristic thereof.

The amount of deviation from the desired frequency of each of the parallel piezoelectric resonator 29 and the series piezoelectric resonator 30 can be determined based on the measurement results. The ion milling time required for adjustment to achieve a desired resonant frequency can be thereby determined based on the relationship between the ion milling time in terms of etching in an argon (Ar) atmosphere and the amount of deviation of the frequency, the relationship being experimentally determined in advance. It is assumed that the ion milling time required for adjusting the parallel piezoelectric resonator 29 at a desired resonant frequency is determined to be $t_1$, and the ion milling time required for adjusting the series piezoelectric resonator 30 at a desired resonant frequency is determined to be $t_2$.

Ion milling of the entire top surface is performed just for a time $t_2$, and thereby, the upper electrode 22*b* is etched to an extent larger than that of the upper electrode 22*a*, so that the series piezoelectric resonator 30 is adjusted at the desired frequency. At this time, the resonant frequency of the parallel piezoelectric resonator 29 is hardly varied because the surface portion of the upper electrode 22*a* of the parallel piezoelectric resonator 29 is covered with the etching retardant film 24. Subsequently, ion milling of the entire bottom surface is performed just for a time $t_1$, and thereby, the lower electrode 23*a* is etched, so that the parallel piezoelectric resonator 29 is adjusted at the desired frequency. At this time, the resonant frequency of the series piezoelectric resonator 30 is hardly varied because the surface portion of the lower electrode 23*b* of the series piezoelectric resonator 30 is covered with the etching retardant film 25.

In this manner, each of the series piezoelectric resonator 30 and the parallel piezoelectric resonator 29 constituting the piezoelectric filter can be individually subjected to the frequency adjustment. Since the frequency adjustment can be separately performed with respect to the top surface and the bottom surface, the series piezoelectric resonator 30 and the parallel piezoelectric resonator 29 can be simultaneously adjusted by respective, arbitrary amounts. Since, the adjustment can be performed in a wafer state, filter elements on the wafer can be subjected to the frequency adjustment by one operation.

In the second preferred embodiment, with respect to the upper electrodes of the series piezoelectric resonator 30 and the parallel piezoelectric resonator 29, the etching retardant film 24 is provided on the upper electrode 22*a* of the parallel piezoelectric resonator 29, and thereby, the etching rate of the upper electrode 22*a* is differentiated from that of the upper electrode 22*b* of the series piezoelectric resonator 30, although not limited to this. The electrode material for the upper electrode 22*a* of the parallel piezoelectric resonator 29 may have an etching rate different from that of the electrode material for the upper electrode 22*b* of the series piezoelectric resonator 30.

In the second preferred embodiment, with respect to the lower electrodes of the series piezoelectric resonator 30 and the parallel piezoelectric resonator 29, the etching retardant film 25 is provided on the lower electrode 23*b* of the series piezoelectric resonator 30, and thereby, the etching rate of the lower electrode 23*b* is differentiated from that of the lower electrode 23*a* of the parallel piezoelectric resonator 29, although it is not limited to this. The electrode material for the lower electrode 23*b* of the series piezoelectric resonator 30 may have an etching rate different from that of the electrode material for the lower electrode 23*a* of the parallel piezoelectric resonator 29.

Third Preferred Embodiment

Figure 11:
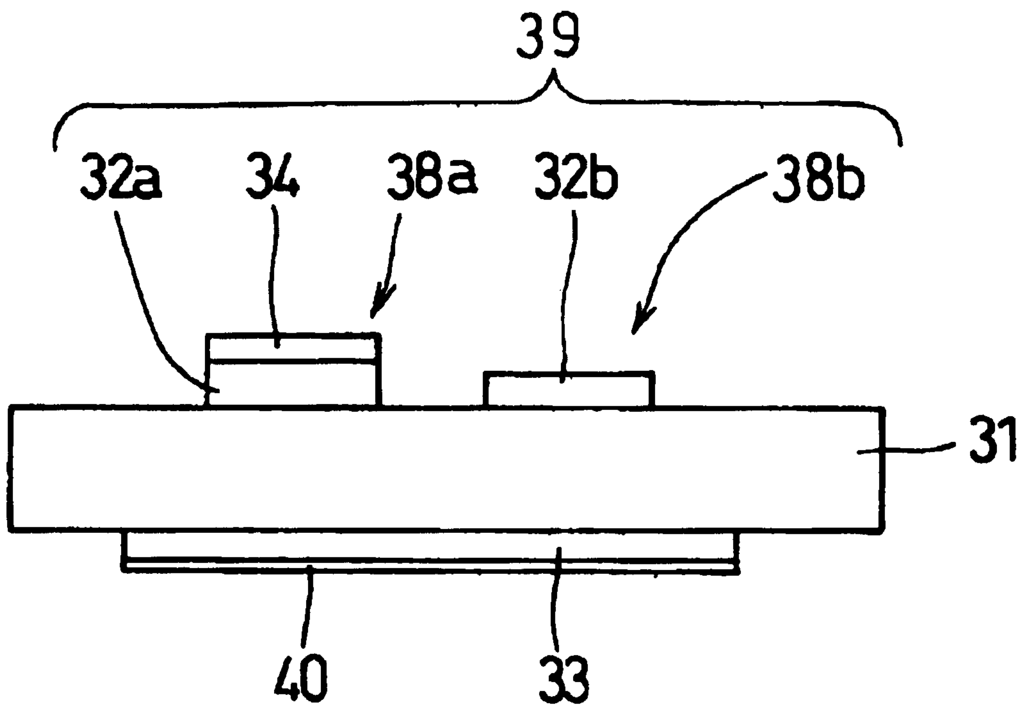
FIG. 11 is a vertical, sectional side view showing another preferred embodiment of a piezoelectric filter according to the present invention.
Figure 12A:
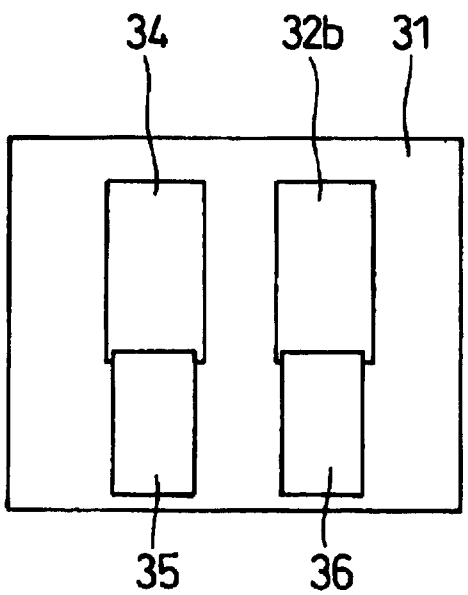
FIGS. 12A and 12B are a plan view and a bottom view, respectively, of the piezoelectric filter shown in FIG. 11.
Figure 12B:
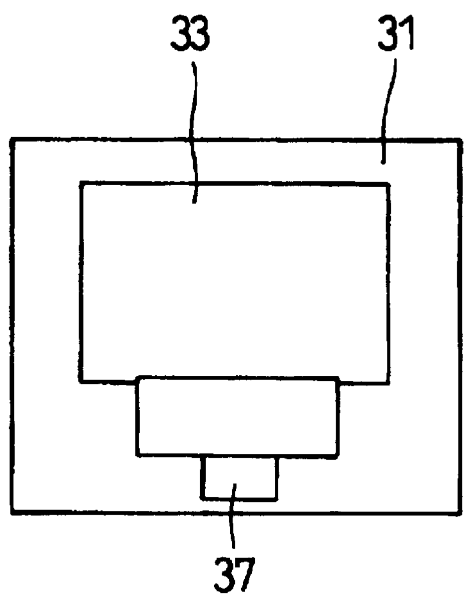
Figure 13A:
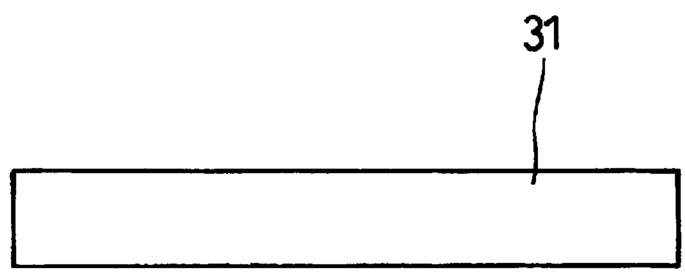
FIGS. 13A to 13C are vertical, sectional side views showing manufacturing steps of the piezoelectric filter shown in FIG. 11.
Figure 13B:
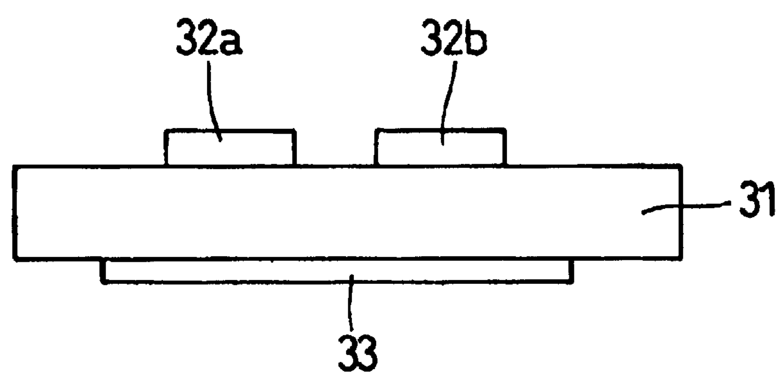
Figure 13C:
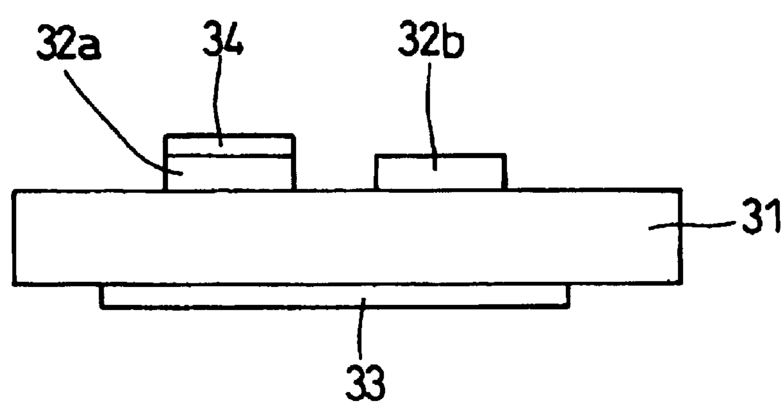

The third preferred embodiment of the piezoelectric filter according to the present invention will be described. FIG. 11 is a vertical, sectional view of the piezoelectric filter. FIGS. 12A and 12B are a plan view and a bottom view, respectively, of the piezoelectric filter shown in FIG. 11. FIGS. 13A to 13C are sectional views of the key portion, illustrating manufacturing steps of the piezoelectric filter shown in FIG. 11.

A piezoelectric filter constituting a double-mode filter is shown in FIG. 11. In FIG. 11 and FIGS. 12A and 12B, reference numeral 31 denotes a piezoelectric substrate preferably made of a thin-plate shaped piezoelectric material formed from lithium tantalate ($LiTaO_3$), reference numerals 32*a* and 32*b* denote upper electrodes made of metal films provided at the respective predetermined positions on the top surface of the substrate 31, reference numerals 33 denotes a lower electrode made of a metal film formed at the predetermined position on the bottom surface of the substrate 31 and reference numeral 34 denotes an etching retardant film further provided on the surface of the upper electrode 32*a*. For example, lithium niobate ($LiNbO_3$), quartz or other suitable material may be used for the substrate 31.

Both the top and bottom surfaces of the substrate 31 are preferably mirror-finished. A pair of upper electrodes 32*a* and 32*b* are films provided at two respective predetermined positions on the top surface of this substrate 31. Each of the upper electrodes 32*a* and 32*b* preferably has the configuration of an approximate rectangle in the plan view. Both the upper electrodes 32*a* and 32*b* are preferably made of aluminum (Al). Both the upper electrodes 32*a* and 32*b* may be formed from a high conductivity material, e.g. gold (Au), in place of aluminum. An etching retardant film 34 made of alumina ($Al_2O_3$) or other suitable material is provided as an additional film on the surface of one upper electrode 32*a*. Alumina has susceptibility to etching lower than that of aluminum under the same condition. The surface portion of the other upper electrode 32*b* remains in its state as formed from aluminum.

A film of lower electrode 33 having the shape of an approximate rectangle, in the plan view, is provided on the bottom surface of the substrate 31 at the position facing both the upper electrodes 32*a* and 32*b*. The lower electrode 33 is preferably made of aluminum. The lower electrode 33 may be formed from a high conductivity material, e.g. gold (Au), in place of aluminum. The lower electrode 33 is provided with an adjusting film 40 by lamination, while the adjusting film 40 has been subjected to the frequency adjustment, as described below.

A lead electrode 35 connected to the upper electrode 32*a* is provided as an input electrode on the top surface of the substrate 31. A lead electrode 36 connected to the upper electrode 32*b* is provided as an output electrode on the top surface of the substrate 31. A lead electrode 37 connected to the lower electrode 33 is provided as a GND electrode on the bottom surface of the substrate 31. Here, the vibration portion 38*a* of the piezoelectric resonator includes the lower electrode 33, the upper electrode 32*a* and a portion of the substrate 31 vertically sandwiched therebetween. The vibration portion 38*b* of the piezoelectric resonator includes the lower electrode 33, the upper electrode 32*b* and a portion of the substrate 31 vertically sandwiched therebetween. The piezoelectric filter 39 is configured by the interaction of the vibration portions 38*a* and 38*b* of the piezoelectric resonators.

A method for manufacturing this piezoelectric filter will be described below with reference to FIGS. 13A to 13C showing the sectional views of specified steps. As shown in FIG. 13A, the substrate 31 preferably made of lithium tantalate ($LiTaO_3$) in the shape of a thin plate with both surfaces mirror-finished is prepared. As shown in FIG. 13B, electrode films are formed all over the substrate 31 from aluminum (Al) or other suitable material as a material by vacuum evaporation, sputtering or other suitable process, while necessary regions on both surfaces of the substrate 31 are individually protected by patterned resist films, although not shown in the drawing. Subsequently, the resist films are peeled off, and therefore, each of the upper electrodes 32*a* and 32*b* and the lower electrode 33 is formed.

As shown in FIG. 13C, an etching retardant film 34 made of alumina ($Al_2O_3$) is formed in accordance with the portion on which the upper electrode 32*a* is provided, by vacuum evaporation, sputtering or other suitable process while masking is performed with a metal mask or the like, although not shown in the drawing.

Lead electrodes 35, 36 and 37 and the like are films provided on the substrate 31. A piezoelectric filter 39 in the condition antecedent to the frequency adjustment is produced through the steps up to this point.

The frequency adjustment of this piezoelectric filter 39 will be described.

The piezoelectric filter 39 in the condition antecedent to the frequency adjustment is placed in an etching apparatus. This etching apparatus is provided with a measurement apparatus for measuring the pass band and the center frequency of the piezoelectric filter. In the etching apparatus, the pass band width and the center frequency of the piezoelectric filter 39 are measured while a high-frequency probe is in contact with the lead electrode 35 as an input terminal, the lead electrode 36 as an output terminal and the lead electrode 37 as a GND terminal.

An etching treatment to reduce the film thickness of the vibration portions 38*a* and 38*b* of the piezoelectric resonator is performed with the etching apparatus based on the measurement results, so that the frequencies are adjusted. For details, the ion milling of the upper electrodes 32*a* and 32*b* on the top surface of the substrate 31 is performed while the pass band width is measured. At this time, since the upper electrode 32*b* is more susceptible to the milling compared with the upper electrode 32*a* provided with the etching retardant film 34, the resonant frequencies in the oblique symmetric mode and the symmetric mode deviate from each other. Consequently, the pass band width is decreased. The processing is performed until the desired pass band width is achieved. After the adjustment by the processing is completed, an adjusting film 40 is formed by an evaporation treatment of, e.g. silver onto the lower electrode 33 on the bottom surface of the substrate 31. The center frequency of the piezoelectric filter 39 is shifted to the lower frequency side due to an effect of the addition of mass through this evaporation. The evaporation treatment is performed until the desired center frequency is achieved.

The double-mode filter having this structure is adjusted at a desired resonant frequency. With respect to the adjustment, the pass band width can be adjusted by etching of the upper electrode on the top surface of the substrate 31, and the center frequency can be adjusted by addition of a film to the lower electrode on the bottom surface of the substrate 31. Since the filter characteristic can be adjusted while the vibration portion is directly subjected to the measurement, the adjustment can be performed with high accuracy.

Fourth Preferred Embodiment

Figure 14:
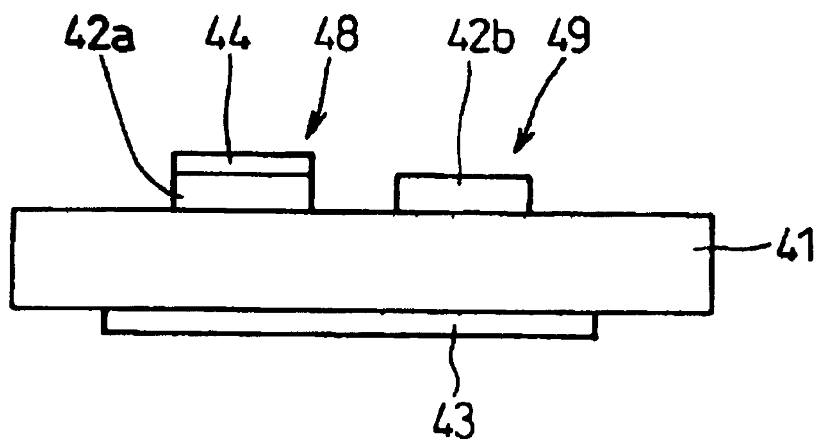
FIG. 14 is a vertical, sectional side view showing another preferred embodiment of a piezoelectric filter according to the present invention.
Figure 15A:
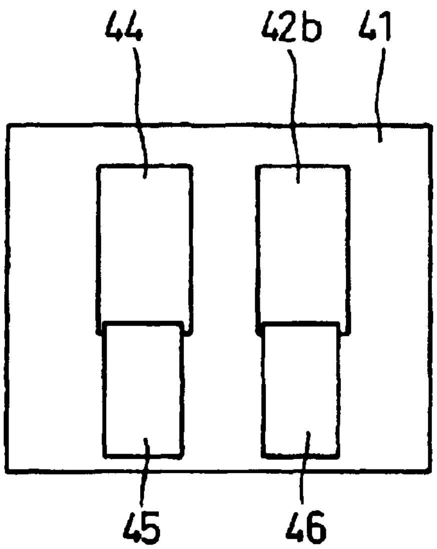
FIGS. 15A and 15B are a plan view and a bottom view, respectively, of the piezoelectric filter shown in FIG. 14.
Figure 15B:
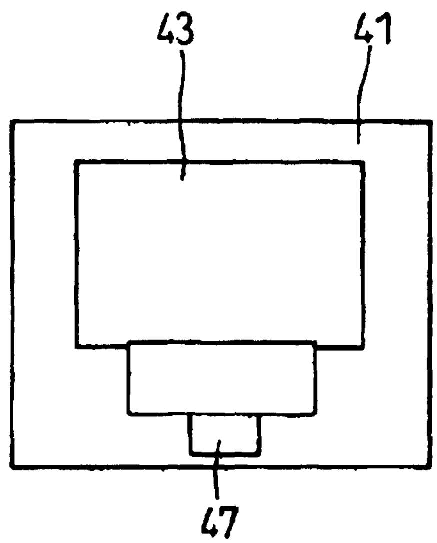
Figure 16A:
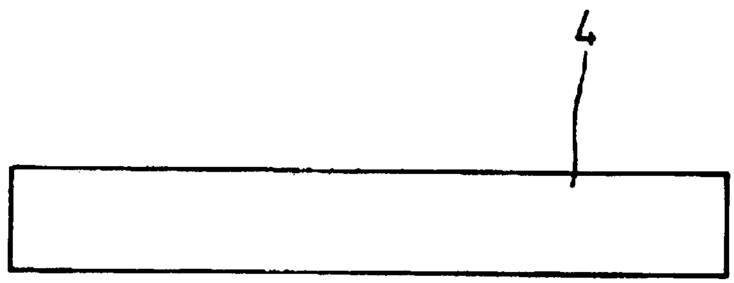
FIGS. 16A to 16C are vertical, sectional side views showing manufacturing steps of the piezoelectric filter shown in FIG. 14.
Figure 16B:
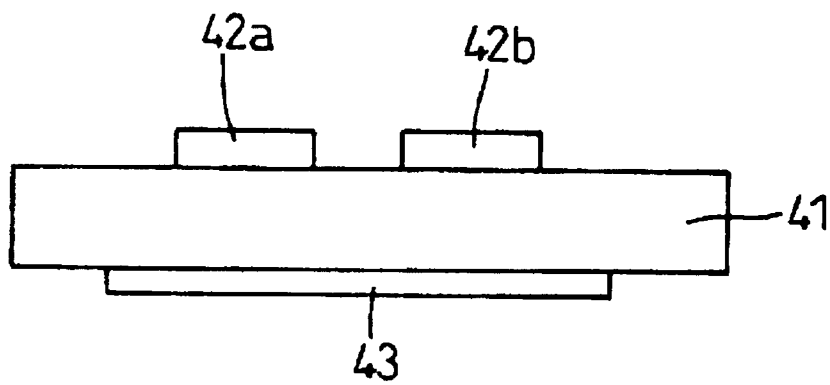
Figure 16C:
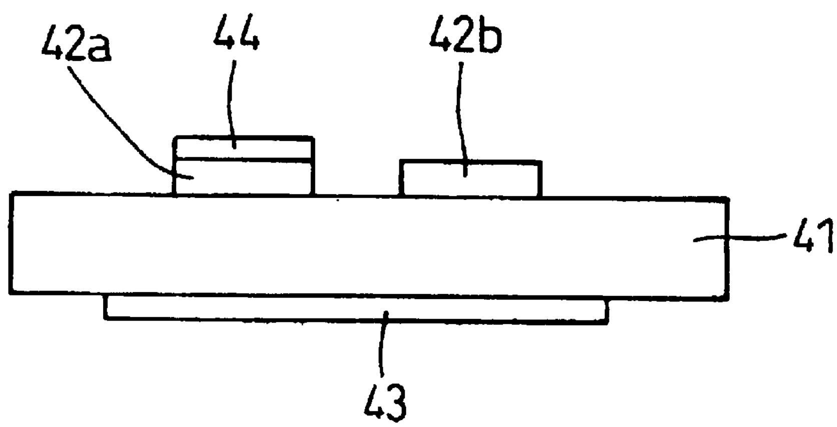

The fourth preferred embodiment of the piezoelectric filter according to the present invention will be described. FIG. 14 is a vertical, sectional view of the piezoelectric filter. FIGS. 15A and 15B are a plan view and a bottom view, respectively, of the piezoelectric filter shown in FIG. 14. FIGS. 16A to 16C are sectional views of the key portion, illustrating manufacturing steps of the piezoelectric filter shown in FIG. 14.

FIG. 14 shows a ladder piezoelectric filter including one series resonator and one parallel resonator. In FIG. 14 and FIGS. 15A and 15B, reference numeral 41 denotes a piezoelectric substrate preferably made of a thin-plate shaped piezoelectric material formed from lithium tantalate ($LiTaO_3$), reference numerals 42*a* and 42*b* denote upper electrodes made of metal films provided at the respective predetermined positions on the top surface of the substrate 41, reference numerals 43 denotes a lower electrode made of a metal film formed at the predetermined position on the bottom surface of the substrate 41 and reference numeral 44 denotes an easy-to-etch film further provided on the surface of the upper electrode 42*a*. For example, lithium niobate ($LiNbO_3$), quartz or other suitable material may be used for the substrate 41.

Both the top and bottom surfaces of the substrate 41 are preferably mirror-finished. A pair of upper electrodes 42*a* and 42*b* are films provided at two respective predetermined positions on the top surface of this substrate 41. Each of the upper electrodes 42*a* and 42*b* is in the shape of an approximate rectangle in the plan view. Both the upper electrodes 42*a* and 42*b* are preferably made of aluminum (Al). An easy-to-etch film 44 made of gold (Au) or other suitable material is provided as an additional film on the surface of one upper electrode 42*a*. Gold has susceptibility to etching higher than that of aluminum under the same condition, and therefore, etching proceeds at a high rate. The surface portion of the other upper electrode 42*b* remains in its state as formed from aluminum.

A film of lower electrode 43 having the shape of an approximate rectangle, in the plan view, is provided on the bottom surface of the substrate 41 at the position facing both the upper electrodes 42*a* and 42*b*. The lower electrode 43 is preferably made of aluminum. The lower electrode 43 may be formed from a high conductivity material, e.g. gold (Au), in place of aluminum. The lower electrode 43 has been subjected to etching in order to adjust the frequency, as described below.

A lead electrode 45 connected to the upper electrode 42*a* is provided as a GND electrode on the top surface of the substrate 41. A lead electrode 46 connected to the upper electrode 42*b* is provided as an output electrode on the top surface of the substrate 41. A lead electrode 47 connected to the lower electrode 43 is provided as an input electrode on the bottom surface of the substrate 41. Here, the piezoelectric resonator 48 is configured to have a vibration portion including the lower electrode 43, the upper electrode 42*a* and a portion of the substrate 41 vertically sandwiched therebetween. The piezoelectric resonator 49 is configured to have a vibration portion including the lower electrode 43, the upper electrode 42*b* and a portion of the substrate 41 vertically sandwiched therebetween.

A method for manufacturing this piezoelectric filter will be described below with reference to FIGS. 16A to 16C showing the sectional views of specified steps. As shown in FIG. 16A, the substrate 41 preferably made of lithium tantalate ($LiTaO_3$) in the shape of a thin plate with both surfaces mirror-finished is prepared. As shown in FIG. 16B, electrode films are formed all over the substrate 41 from aluminum (Al) or other suitable material as a material by vacuum evaporation, sputtering or other suitable process, while necessary regions on both surfaces of the substrate 41 are individually protected by patterned resist films, although not shown in the drawing. Subsequently, the resist films are peeled off, and therefore, each of the upper electrodes 42*a* and 42*b* and the lower electrode 43 is formed.

As shown in FIG. 16C, an easy-to-etch film 44 made of gold (Au) is formed in accordance with the portion on which the upper electrode 42*a* is provided, by vacuum evaporation, sputtering or other suitable process while masking is performed with a metal mask or the like, although not shown in the drawing.

Films of lead electrodes 45, 46 and 47 and the like are formed on the substrate 41. A piezoelectric filter in the condition antecedent to the frequency adjustment is produced through the steps up to this point.

The frequency adjustment of this piezoelectric filter will be described. With respect to each of the piezoelectric resonator 48 and the piezoelectric resonator 49, processing for reducing the thickness thereof is individually performed, and thereby, the resonant frequency of each of the piezoelectric resonators 48 and 49 is adjusted at the desired frequency. A measurement apparatus, e.g. a high-frequency network analyzer, is used for this adjustment. A frequency signal from the high-frequency network analyzer is input between the lead electrode 45 and the lead electrode 47, and thereby, the vibration portion located therebetween is excited, so that the resonant frequency of the piezoelectric resonator 48 is measured. Likewise, a frequency signal from the high-frequency network analyzer is input between the lead electrode 46 and the lead electrode 47, and thereby, the vibration portion located therebetween is excited, so that the resonant frequency of the piezoelectric resonator 49 is measured.

The amount of deviation from the desired frequency of each of the piezoelectric resonators 48 and 49 can be determined based on the measurement results. The ion milling time required for adjustment to achieve a desired resonant frequency can be thereby determined based on the relationship between the ion milling time in terms of etching in an argon (Ar) atmosphere and the amount of deviation of the frequency, the relationship being experimentally determined in advance. It is assumed that the ion milling time required for adjusting the piezoelectric resonator 48 at a desired resonant frequency is determined to be $t_1$, and the ion milling time required for adjusting the piezoelectric resonator 49 at a desired resonant frequency is determined to be $t_2$.

Ion milling of the entire top surface is performed just for a time $t_1$, and thereby, the easy-to-etch film 44 provided on the upper electrode 42*a* is etched to a greater extent than that of the upper electrode 42*b*, so that the resonant frequency of the piezoelectric resonator 48 is shifted to the higher side, and is adjusted at the desired frequency. At this time, since the surface portion of the upper electrode 42*a* of the piezoelectric resonator 48 is covered with the easy-to-etch film 44, the resonant frequency of this piezoelectric resonator 48 is shifted more than the resonant frequency of the piezoelectric resonator 49. In this manner, the pass band width can be adjusted to a desired value. Subsequently, ion milling of the entire bottom surface is performed just for a time $t_2$, and thereby, the lower electrode 43 is etched. Consequently, the center frequency of the piezoelectric filter can be adjusted.

Fifth Preferred Embodiment

A duplexer according to a preferred embodiment of the present invention will be described.

Figure 17:
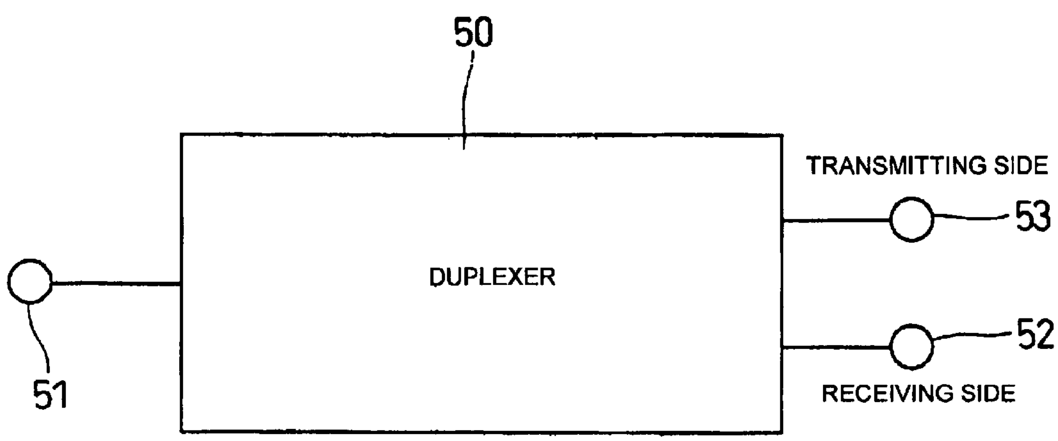
FIG. 17 is a schematic diagram illustrating a duplexer according to a preferred embodiment of the present invention.

A duplexer 50 shown in FIG. 17 is provided with an antenna terminal 51, a receiving-side terminal 52 and a transmitting-side terminal 53. In the configuration, piezoelectric filters according to other preferred embodiments of the present invention are provided between the receiving-side terminal 52 and the antenna terminal 51, and between the transmitting-side terminal 53 and the antenna terminal 51, while the piezoelectric filters simply permit passing of signals within a desired frequency band.

Sixth Preferred Embodiment

Figure 18:
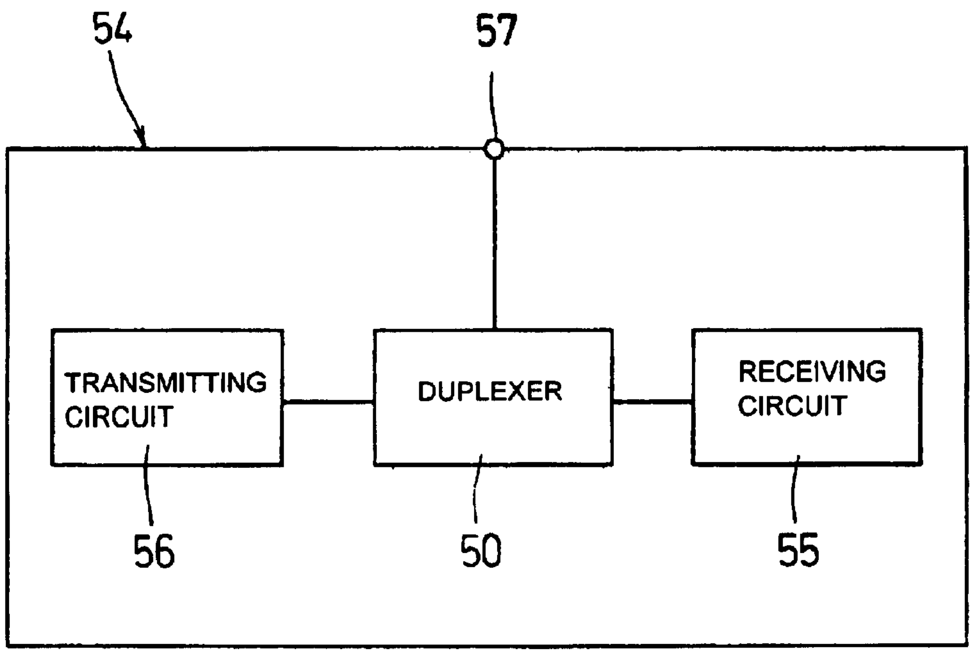
FIG. 18 is a schematic diagram illustrating an example of a communication device according to a preferred embodiment of the present invention.

A communication device according to another preferred embodiment of the present invention will be described. FIG. 18 is a simplified block diagram of the communication device.

The main body of this communication device 54 is provided with a receiving circuit 55, a transmitting circuit 56 and an antenna 57, as shown in FIG. 18. Signals are transmitted between the antenna 57 and the transmitting circuit 56 and between the antenna 57 and the receiving circuit 55 via the duplexer 50 described above in the fifth preferred embodiment. This duplexer 50 includes the piezoelectric filter according to a preferred embodiment of the present invention as a circuit element, and thereby, the operating characteristics of this communication device are stabilized.

Seventh Preferred Embodiment

Figure 19:
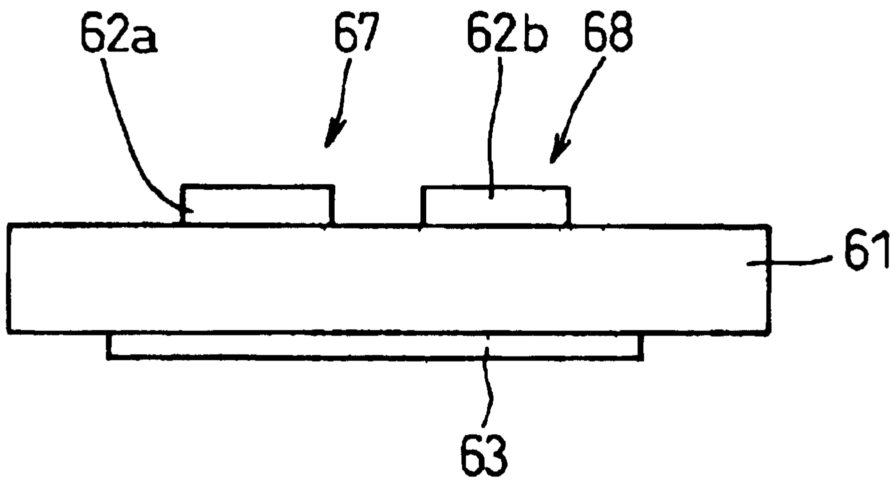
FIG. 19 is a vertical, sectional side view showing another preferred embodiment of a piezoelectric filter according to the present invention.
Figure 20A:
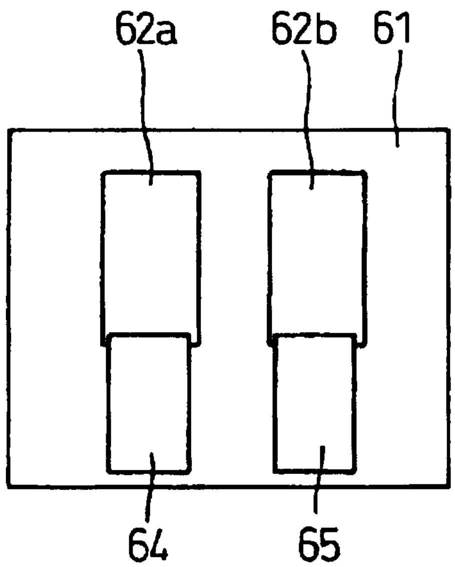
FIGS. 20A and 20B are a plan view and a bottom view, respectively, of the piezoelectric filter shown in FIG. 19.
Figure 20B:
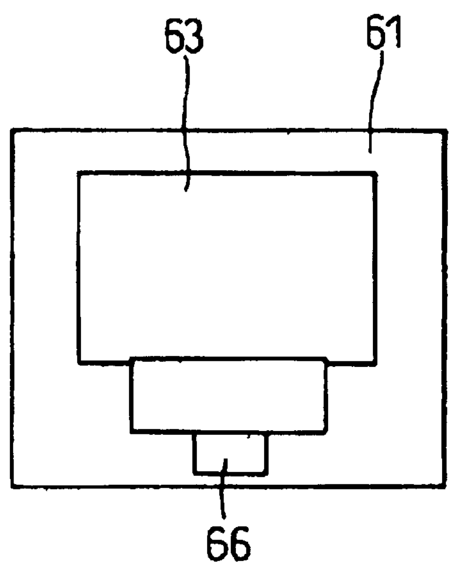

The seventh preferred embodiment related to a ladder piezoelectric filter according to the present invention will be briefly described. FIG. 19 is a vertical, sectional view of a piezoelectric filter. FIGS. 20A and 20B are a plan view and a bottom view, respectively, of the piezoelectric filter shown in FIG. 19.

As shown in FIG. 19 and FIGS. 20A and 20B, films of a pair of upper electrodes 62*a* and 62*b* are provided on the top surface side of a piezoelectric substrate 61 which is preferably made of a thin-plate shaped piezoelectric material. A film defining a lower electrode 63 is provided on the bottom surface side of the substrate 61 to face each of the upper electrodes 62*a* and 62*b*.

A lead electrode 64 connected to the upper electrode 62*a* is provided as a GND electrode on the top surface of the substrate 61. A lead electrode 65 connected to the upper electrode 62*b* is provided as an output electrode on the top surface of the substrate 61. A lead electrode 66 connected to the lower electrode 63 is provided as an input electrode on the bottom surface of the substrate 61. The parallel piezoelectric resonator 67 is provided to have a vibration portion including the upper electrode 62*a*, the lower electrode 63 and a portion of the substrate 61 sandwiched between both electrodes 62*a* and 63. The series piezoelectric resonator 68 is provided to have a vibration portion including the upper electrode 62*b*, the lower electrode 63 and a portion of the substrate 61 sandwiched between both the electrodes 62*b* and 63.

The upper electrode 62*a* is a film preferably formed from gold (Au). The upper electrode 62*a* and the lower electrode 63 are films preferably formed from aluminum (Al). Consequently, the upper electrode 62*a* is more susceptible to etching compared with the upper electrode 62*b* under the same condition.

The frequency adjustment of this piezoelectric filter will be described. With respect to each of the parallel piezoelectric resonator 67 and the series piezoelectric resonator 68, processing for reducing the thickness thereof is individually performed, and thereby, the resonant frequency of each of the piezoelectric resonators 67 and 68 is adjusted to the desired frequency. A measurement apparatus, e.g. a high-frequency network analyzer, is used for this adjustment. A frequency signal from the high-frequency network analyzer is input between the input electrode 66 and the GND electrode 64, and thereby, the vibration portion located therebetween is excited, so that the resonant frequency of the parallel piezoelectric resonator 67 is measured. Likewise, a frequency signal from the high-frequency network analyzer is input between the input electrode 66 and the electrode 65, and thereby, the vibration portion located therebetween is excited, so that the resonant frequency of the series piezoelectric resonator 68 is measured.

The amount of deviation from the desired frequency of each of the parallel piezoelectric resonator 67 and the series piezoelectric resonator 68 can be determined based on the measurement results. The ion milling time required for adjustment to achieve a desired resonant frequency can be thereby determined based on the relationship between the ion milling time in terms of etching in an argon (Ar) atmosphere and the amount of deviation of the frequency, the relationship being experimentally determined in advance. It is assumed that the ion milling time required for adjusting the parallel piezoelectric resonator 67 to a desired resonant frequency is determined to be $t_1$, and the ion milling time required for adjusting the series piezoelectric resonator 68 to a desired resonant frequency is determined to be $t_2$.

Ion milling of the entire top surface is performed just for a time $t_1$, and thereby, the upper electrode 62*a* is etched to an extent larger than that of the upper electrode 62*b*, so that the resonant frequency of the piezoelectric resonator 67 is shifted to the higher side, and is adjusted at the desired frequency. At this time, since the upper electrode 62*a* of the piezoelectric resonator 67 is more susceptible to etching compared with the upper electrode 62*b*, the resonant frequency of this piezoelectric resonator 67 is shifted larger than the resonant frequency of the piezoelectric resonator 68. In this manner, the pass band width of the piezoelectric filter can be adjusted to a desired value. Subsequently, ion milling of the entire bottom surface is performed just for a time $t_2$, and thereby, the lower electrode 63 is etched. Consequently, the center frequency of the piezoelectric filter can be adjusted.

The present invention is not limited to that described above in each of the various preferred embodiments. The present invention may include, for example, the following modifications and applications.

(1) The piezoelectric thin film constituting the vibration portion may be composed of a piezoelectric thin film primarily including AlN. The piezoelectric thin film may be formed by lamination of a plurality of layers.

(2) The piezoelectric filter may be provided with at least three piezoelectric resonators on a substrate basis, while the piezoelectric resonator includes a vibration portion having a configuration in which a piezoelectric material is sandwiched between an upper electrode and a lower electrode facing each other. In a composite piezoelectric resonator configured to include a plurality of piezoelectric resonators in place of the piezoelectric filter, the resonant frequency of a specific piezoelectric resonator may be adjusted. For example, upper electrodes of the plurality of piezoelectric resonators may be composed of materials having different etching proceeding rates, or an additional film may be provided on an upper electrode of a specific piezoelectric resonator while the additional film is made of a material having an etching proceeding rate different from that of the upper electrode.

Figure 21:
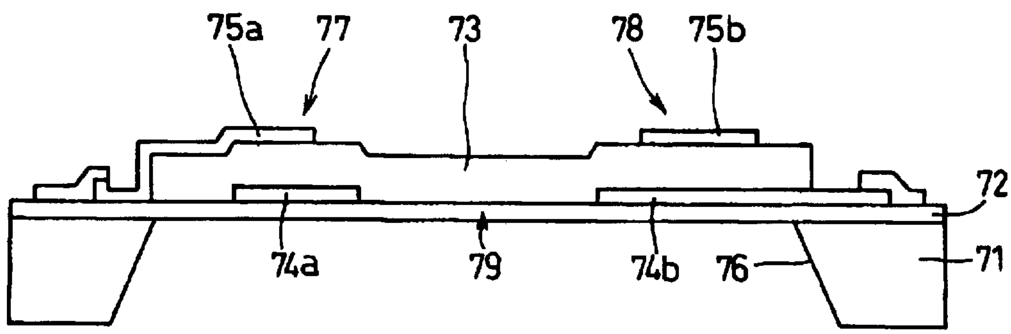
FIG. 21 is a vertical, sectional side view showing another preferred embodiment of a piezoelectric filter according to the present invention.

(3) Another preferred embodiment of the piezoelectric filter according to the present invention will be described with reference to FIG. 21. This preferred embodiment is an example of the above-described first piezoelectric filter. Furthermore, this preferred embodiment is an example of the above-described first piezoelectric filter and the above-described first method for adjusting the frequency of a piezoelectric filter.

This piezoelectric filter includes a substrate 71, and a parallel piezoelectric resonator 77 and a series piezoelectric resonator 78 provided on an opening 76 of the substrate 71. For details, reference numeral 71 denotes a silicon substrate susceptible to anisotropic etching, reference numeral 72 denotes a thin film made of silicon oxide ($SiO_2$), reference numeral 73 denotes a piezoelectric thin film as a thin film portion including at least one layer primarily including zinc oxide (ZnO), reference numerals 74*a* and 74*b* denote lower electrodes made of aluminum (Al) or other suitable material, and reference numerals 75*a* and 75*b* denote upper electrodes. The upper electrode 75*a* is a film that is preferably formed from aluminum (Al). The upper electrode 75*b* is a film that is preferably formed from gold (Au). Consequently, the upper electrode 75*b* is more susceptible to etching compared with the upper electrode 75*a* under the same condition. The films of upper electrodes 75*a* and 75*b* are formed to have respective predetermined film thicknesses.

A vibration portion including the lower electrode 74*a*, piezoelectric thin film 73 and the upper electrode 75*a* and a vibration portion including the lower electrode 74*b*, piezoelectric thin film 73 and the upper electrode 75*b* constitute a parallel piezoelectric resonator 77 and a series piezoelectric resonator 78, respectively, on a diaphragm 79.

The frequency adjustment of this piezoelectric filter will be described. With respect to the series piezoelectric resonator 78, processing for reducing the thickness thereof is performed, and thereby, the resonant frequency of the series piezoelectric resonator 78 is shifted to the higher frequency side. Consequently, the difference between the resonant frequency of the series piezoelectric resonator 78 and the resonant frequency of the parallel piezoelectric resonator 77 is changed, and the pass band width is thereby adjusted to become a desired value. A measurement apparatus, e.g. a high-frequency network analyzer, may be used for this adjustment. In this case, the center frequency, the pass band width and other characteristics of the ladder filter composed of the parallel piezoelectric resonator 77 and the series piezoelectric resonator 78 are measured with the high-frequency network analyzer.

With respect to the pass band width, the amount of deviation from the desired value of the pass band width required of the piezoelectric filter is determined based on this measurement result. The ion milling time $t_1$ required for the frequency adjustment to achieve a desired pass band width can be calculated based on the relationship between the ion milling time in terms of etching in an argon (Ar) atmosphere and the amount of decrease in the pass band width of a good piezoelectric filter, the relationship being experimentally determined in advance. Numerical values of the ion milling rates in this argon atmosphere are specifically shown below. The ion milling rates are about 2.0 (nm/min) with respect to aluminum, and about 10.0 (nm/min) with respect to gold.

The above-described piezoelectric filter is introduced into an ion milling apparatus, and the surface is etched just for a time $t_1$ in the argon atmosphere based on the above-described calculation result. With respect to the upper electrodes 75*a* and 75*b*, the upper electrode 75*b* is more susceptible to etching compared with the upper electrode 75*a*. Consequently, the reduction in thickness of the upper electrode 75*b* is accelerated by this etching, and the resonant frequency of the series piezoelectric resonator 78 is adjusted to shift to the higher side. The pass band width is adjusted to a desired value by changing the difference between the resonant frequency of the series piezoelectric resonator 78 and the resonant frequency of the parallel piezoelectric resonator 77. Subsequently, the frequency of the total piezoelectric filter is adjusted by reduction of the thickness of the thin film 72 through etching or by addition of the adjusting film, each performed from the opening 76 side.

As described above, in the present preferred embodiment, with respect to the ladder piezoelectric filter, the upper electrode of the series piezoelectric resonator and the upper electrode of the parallel piezoelectric resonator are formed from materials having different susceptibility to etching under the same condition, and thereby, the degree of change in frequency due to etching of the series piezoelectric resonator is differentiated from that of the parallel piezoelectric resonator. In this manner, the difference in resonant frequency between the series piezoelectric resonator and the parallel piezoelectric resonator is adjusted by etching of the upper electrodes without using a mask and the like, and therefore, the pass band width of the piezoelectric filter can be adjusted to a desired value. In particular, with respect to the piezoelectric filter in which the substrate having the opening is provided, and the vibration portions of the piezoelectric resonators are provided on the opening, after the pass band width of the piezoelectric filter is adjusted to a desired value by etching of the upper electrode, the total piezoelectric filter can be adjusted by etching of the thin film provided to block the opening or by addition of the adjusting film to the thin film, each performed from the opening side.

The piezoelectric filter shown in this case (3) is composed of each of the piezoelectric resonators. However, each of the piezoelectric resonators may not be electrically connected to each other, and a composite piezoelectric resonator may be configured, in which a plurality of piezoelectric resonators are arranged on the same substrate.

Figure 22:
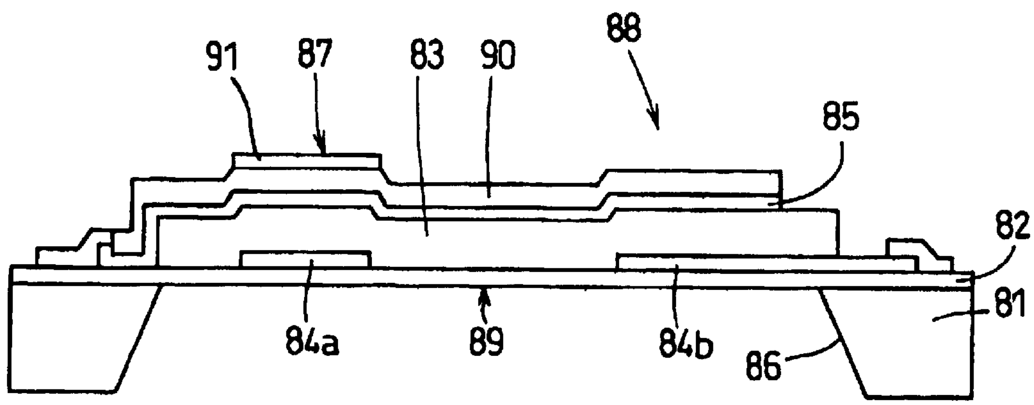
FIG. 22 is a vertical, sectional side view showing another preferred embodiment of a piezoelectric filter according to the present invention.

(4) Another preferred embodiment of the piezoelectric filter according to the present invention will be described with reference to FIG. 22. This preferred embodiment is an example of the above-described third piezoelectric filter and the above-described third method for adjusting the frequency of a piezoelectric filter.

This piezoelectric filter includes a substrate 81 and two vibration portions of a parallel piezoelectric resonator 87 and a series piezoelectric resonator 88 provided on an opening 86 of the substrate 81. For details, reference numeral 81 denotes a silicon substrate susceptible to anisotropic etching, reference numeral 82 denotes a thin film made of silicon oxide ($SiO_2$), reference numeral 83 denotes a piezoelectric thin film as a thin film portion including at least one layer primarily including zinc oxide (ZnO), reference numerals 84*a* and 84*b* denote lower electrodes made of aluminum (Al) or other suitable material and reference numeral 85 denotes an upper electrode also made of aluminum (Al) or other suitable material. The upper electrode 85 is a film that is preferably formed from aluminum (Al). The film of the upper electrode 85 is arranged to face each of the lower electrodes 84*a* and 84*b* in the thickness direction in order to be shared between two vibration portions of the parallel piezoelectric resonator 87 and the series piezoelectric resonator 88. A protective film 90 made of $SiO_2$, SiN, $Al_2O_3$ or other suitable material is provided by lamination on the upper electrode 85. A film of additional electrode 91 is arranged on the protective film 90 so as to face the lower electrode 84*a* in the thickness direction. This additional electrode 91 is a film formed from gold (Au) or other suitable material. The protective film 90 has an insulation property, and there is no electrical continuity between the additional electrode 91 and the upper electrode 85. The protective film 90 and the additional electrode 91 have different etching rates under the same condition. Furthermore, the protective film 90 and the additional electrode 91 are films formed to have predetermined thicknesses.

Here, a vibration portion including the lower electrode 84*a*, the piezoelectric thin film 83, the upper electrode 85 and the protective film 90 and a vibration portion including the lower electrode 84*b*, the piezoelectric thin film 83, the upper electrode 85, the protective film 90 and the additional electrode 91 constitute a parallel piezoelectric resonator 87 and a series piezoelectric resonator 88, respectively, on a diaphragm 89.

The frequency adjustment of this piezoelectric filter will be described. With respect to the parallel piezoelectric resonator 87, processing for reducing the thickness thereof is performed, and thereby, the resonant frequency of the parallel piezoelectric resonator 87 is adjusted to become close to the resonant frequency of the series piezoelectric resonator 88. A measurement apparatus, e.g. a high-frequency network analyzer, may be used for this adjustment. In this case, the center frequency, the pass band width, and other characteristics of the filter composed of the parallel piezoelectric resonator 87 and the series piezoelectric resonator 88 are measured with the high-frequency network analyzer.

With respect to the pass band width, the amount of deviation from the desired value of the pass band width required of the piezoelectric filter is determined based on this measurement result. The ion milling time $t_1$ required for the frequency adjustment to achieve a desired pass band width can be calculated based on the relationship between the ion milling time in terms of etching in an argon (Ar) atmosphere and the amount of decrease in the pass band width of a good piezoelectric filter, the relationship being experimentally determined in advance.

The above-described piezoelectric filter is introduced into an ion milling apparatus, and the surface is etched just for a time $t_1$ in the argon atmosphere based on the above-described calculation result. With respect to the additional electrode 91 and the protective film 90, the additional electrode 91 is more susceptible to etching compared with the protective film 90. Consequently, reduction in thickness of the additional electrode 91 is accelerated by this etching, and the resonant frequency of the parallel piezoelectric resonator 87 is adjusted to shift to the higher side. The difference between the resonant frequency of the series piezoelectric resonator 88 and the resonant frequency of the parallel piezoelectric resonator 87 is thus changed, and the pass band width is thereby adjusted to become a desired value. Subsequently, the frequency of the total piezoelectric filter is adjusted by reduction of the thickness of the thin film 82 through etching or by addition of an adjusting film, each performed from the opening 86 side.

As described above, in the present preferred embodiment, with respect to the ladder piezoelectric filter, the vibration portions of both the series piezoelectric resonator and the parallel piezoelectric resonator are covered with the protective film, and furthermore, the additional electrode having a different etching rate from that of the protective film under the same condition is provided on one of the upper electrodes of the series piezoelectric resonator and the parallel piezoelectric resonator with the protective film therebetween. Consequently, the degree of change in frequency due to etching of the series piezoelectric resonator is differentiated from that of the parallel piezoelectric resonator. In this manner, the difference in resonant frequency between the series piezoelectric resonator and the parallel piezoelectric resonator is adjusted by etching of the protective film and the additional electrode without using a mask and the like, and therefore, the pass band width of the piezoelectric filter can be adjusted to a desired value. In particular, with respect to the piezoelectric filter in which the substrate having the opening is provided, and the vibration portions of the piezoelectric resonators are provided on the opening, after the pass band width of the piezoelectric filter is adjusted to a desired value by etching of the upper electrode, the total piezoelectric filter can be adjusted by etching of the thin film provided to block the opening or by addition of the adjusting film to the thin film, each performed from the opening side.

(5) A piezoelectric filter, in which a concavity having a bottom is provided as a concave portion in the substrate surface, and piezoelectric resonators are provided on the concave portion, may be an embodiment that is different from the piezoelectric filter having a configuration in which an opening composed of a through hole vertically penetrating a substrate is provided as a vibration space in the substrate, and in addition, a diaphragm for constituting a vibration portion is provided to cover the opening.

Figure 23:
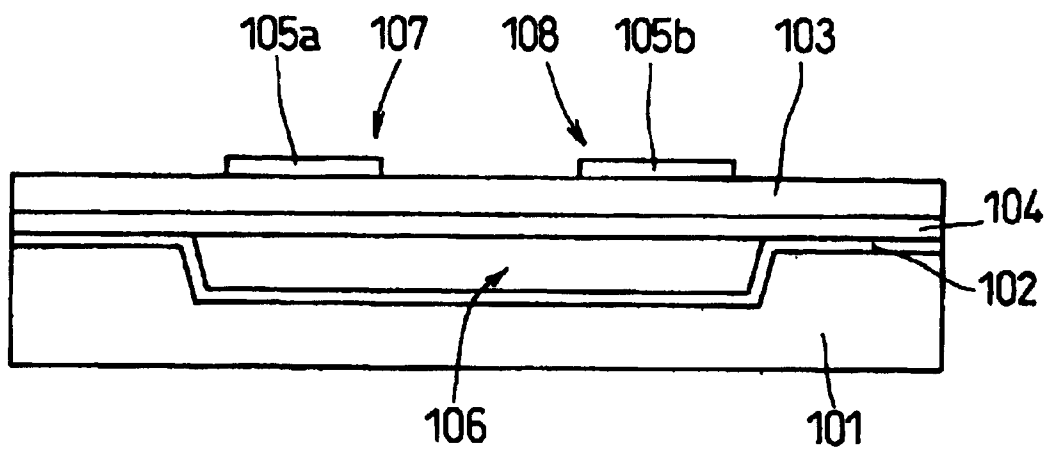
FIG. 23 is a vertical, sectional side view showing another preferred embodiment of a piezoelectric filter according to the present invention.

Another preferred embodiment of the piezoelectric filter according to the present invention will be specifically described with reference to FIG. 23.

This piezoelectric filter includes a substrate 101 and two vibration portions of a parallel piezoelectric resonator 107 and a series piezoelectric resonator 108 provided on a concave portion 106 which has a bottom and which is arranged on the top surface side of the substrate 101. For details, reference numeral 101 denotes a silicon substrate that is susceptible to anisotropic etching, reference numeral 102 denotes a insulating thin film made of silicon oxide ($SiO_2$), reference numeral 103 denotes a piezoelectric thin film as a thin film portion including at least one layer primarily including zinc oxide (ZnO), reference numerals 104 denotes a lower electrode made of aluminum (Al) or the like and reference numerals 105*a* and 105*b* denote upper electrodes. The upper electrode 105*a* is a film that is preferably formed from aluminum (Al). The upper electrode 105*b* is a film that is preferably formed from gold (Au). Consequently, the upper electrode 105*b* is more susceptible to etching compared with the upper electrode 105*a* under the same condition. The upper electrodes 105*a* and 105*b* are films formed to have respective predetermined film thicknesses.

A vibration portion including the lower electrode 104, piezoelectric thin film 103 and the upper electrode 105*a* and a vibration portion including the lower electrode 104, piezoelectric thin film 103 and the upper electrode 105*b* constitute a parallel piezoelectric resonator 107 and a series piezoelectric resonator 108 respectively.

The frequency adjustment of this piezoelectric filter will be described. With respect to the series piezoelectric resonator 108, processing for reducing the thickness thereof is performed, and thereby, the resonant frequency of the series piezoelectric resonator 108 is shifted to the higher frequency side. Consequently, the difference between the resonant frequency of the series piezoelectric resonator 108 and the resonant frequency of the parallel piezoelectric resonator 107 is changed, and the pass band width is thereby adjusted to become a desired value. A measurement apparatus, e.g. a high-frequency network analyzer, may be used for this adjustment. In this case, the center frequency, the pass band width and other characteristics of the filter composed of the parallel piezoelectric resonator 107 and the series piezoelectric resonator 108 are measured with the high-frequency network analyzer.

With respect to the pass band width, the amount of deviation from the desired value of the pass band width required of the piezoelectric filter is determined based on this measurement result. The ion milling time $t_1$ required for the frequency adjustment to achieve a desired pass band width can be calculated based on the relationship between the ion milling time in terms of etching in an argon (Ar) atmosphere and the amount of decrease in the pass band width of a good piezoelectric filter, the relationship being experimentally determined in advance. Numerical values of the ion milling rates in this argon atmosphere are specifically shown below. The ion milling rates are about 2.0 (nm/min) with respect to aluminum, and about 10.0 (nm/min) with respect to gold.

The above-described piezoelectric filter is introduced into an ion milling apparatus, and the surface is etched just for a time $t_1$ in the argon atmosphere based on the above-described calculation result. With respect to the upper electrodes 105*a* and 105*b*, the upper electrode 105*b* is more susceptible to etching compared with the upper electrode 105*a*. Consequently, reduction in thickness of the upper electrode 105*b* is accelerated by this etching, and the resonant frequency of the series piezoelectric resonator 108 is adjusted to shift to the higher side. The pass band width is adjusted to a desired value by changing the difference between the resonant frequency of the series piezoelectric resonator 108 and the resonant frequency of the parallel piezoelectric resonator 107.

The piezoelectric filter shown in this case (5) is composed of each of the piezoelectric resonators. However, each of the piezoelectric resonators may not be electrically connected to each other, and a composite piezoelectric resonator may be configured, in which a plurality of piezoelectric resonators are arranged on the same substrate.

(6) Although not specifically shown in the drawing, the above-described fourth piezoelectric filter according to a preferred embodiment of the present invention may be, for example, a piezoelectric filter described below.

Two upper electrodes made of metal films arranged at respective predetermined positions are provided on the top surface of a piezoelectric substrate preferably made of a thin-plate shaped piezoelectric material formed from lithium tantalate ($LiTaO_3$). A lower electrode facing each of the upper electrodes with the piezoelectric substrate therebetween in the thickness direction is provided on the bottom surface of this piezoelectric substrate. A piezoelectric resonator is configured to include a vibration portion including each of the upper electrode and lower electrode facing each other and a portion of the piezoelectric substrate sandwiched between those electrodes. A protective film made of aluminum (Al) or other suitable material is arranged to cover at least the entire upper electrodes of the vibration portions of both the piezoelectric resonators and a portion of the top surface of the piezoelectric substrate between the two vibration portions. Furthermore, a film of additional electrode made of gold (Au) or other suitable material is laminated on the protective film surface of one upper electrode. The protective film has electrical conductivity, and there is electrical continuity between the additional electrode and the upper electrode via the protective film. The protective film and the additional electrode have different etching rates under the same condition. Furthermore, the protective film and the additional electrode are films formed to have predetermined thicknesses. For example, lithium niobate ($LiNbO_3$), quartz or other suitable material may be used for the piezoelectric substrate.

In this case as well, the frequency of the vibration portion can be adjusted in a manner similar to that in the above-described preferred embodiments of each piezoelectric filter.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A piezoelectric filter comprising:

a plurality of piezoelectric resonators including a substrate and a vibration portion provided on the substrate, the vibration portion having a structure in which top and bottom surfaces of a thin film portion including at least one piezoelectric thin film are sandwiched between at least a pair of an upper electrode and a lower electrode facing each other; and an additional film provided on the upper electrode of at least one of the plurality of piezoelectric resonators; wherein the additional film has susceptibility to physical etching that is lower than that of materials used for the upper electrodes of the others of the plurality of piezoelectric resonators.

2. The piezoelectric filter according to claim 1, wherein the upper electrodes of the plurality of piezoelectric resonators are made of the same material.

3. A piezoelectric filter comprising:

a plurality of piezoelectric resonators including a substrate and a vibration portion provided on the substrate, the vibration portion having a structure in which top and bottom surfaces of a thin film portion including at least one piezoelectric thin film are sandwiched between at least a pair of an upper electrode and a lower electrode facing each other; wherein the vibration portions of the plurality of piezoelectric resonators are covered with a protective film, and an additional electrode is provided on the upper electrode of at least one of the plurality of piezoelectric resonators with the protective film being located therebetween; and the protective film has susceptibility to physical etching that is lower than that of the additional electrode.

4. The piezoelectric filter according to claim 1, wherein the piezoelectric thin film includes one of ZnO and AlN.

5. The piezoelectric filter according to claim 1, wherein the substrate has at least one of an opening and a concave portion, and the vibration portion is provided on the at least one of the opening and the concave portion.

6. A piezoelectric filter comprising:

a plurality of piezoelectric resonators including a piezoelectric substrate and a vibration portion having a structure in which the piezoelectric substrate is sandwiched between at least a pair of an upper electrode and a lower electrode facing each other; wherein the upper electrode of at least one of the plurality of piezoelectric resonators is made of a material having susceptibility to etching that is different from that of the upper electrodes of the other piezoelectric resonators.

7. A piezoelectric filter comprising:

a plurality of piezoelectric resonators including a piezoelectric substrate and a vibration portion having a structure in which the piezoelectric substrate is sandwiched between at least a pair of an upper electrode and a lower electrode facing each other; wherein an additional film is provided on the upper electrode of at least one of the plurality of piezoelectric resonators, and the additional film has susceptibility to etching that is different from that of the material for the upper electrode.

8. The piezoelectric filter according to claim 6, wherein the vibration portions of the plurality of piezoelectric resonators are covered with a protective film, and an additional electrode is provided on the upper electrode of at least one of the plurality of piezoelectric resonators with the protective film being located therebetween.

9. The piezoelectric filter according to claim 6, wherein the lower electrode of at least one of the plurality of piezoelectric resonators is made of a material having susceptibility to etching that is different from that of the lower electrodes of the other piezoelectric resonators.

10. The piezoelectric filter according to claim 6, wherein an additional film is provided on the lower electrode of at least one of the plurality of piezoelectric resonators, and the additional film has susceptibility to etching that is different from that of the materials for the lower electrodes of the other piezoelectric resonators.

11. The piezoelectric filter according to claim 6, wherein at least a portion of the plurality of piezoelectric resonators share a lower electrode.

12. The piezoelectric filter according to claim 1, wherein the plurality of piezoelectric resonators are arranged in a ladder configuration.

13. A duplexer comprising the piezoelectric filter according to claim 1.

14. A composite piezoelectric resonator comprising:

a plurality of piezoelectric resonators including a substrate and a vibration portion provided on the substrate, the vibration portion having a structure in which top and bottom surfaces of a thin film portion including at least one piezoelectric thin film are sandwiched between at least a pair of an upper electrode and a lower electrode facing each other; and an additional film provided on the upper electrode of at least one of the plurality of piezoelectric resonators; wherein the additional film has susceptibility to physical etching that is lower than that of materials used for the upper electrodes of the others of the plurality of piezoelectric resonators.

15. The composite piezoelectric resonator according to claim 14, wherein the piezoelectric thin film includes at least one of ZnO and AlN.

16. The composite piezoelectric resonator according to claim 14, wherein the substrate has at least one of an opening and a concave portion, and the vibration portion is provided on the at least one of the opening and the concave portion.

17. A communication device comprising at least one of the piezoelectric filter according to claim 1, the duplexer according to claim 13, and the composite piezoelectric resonator according to claim 14.

18. A method for adjusting the frequency of a piezoelectric filter comprising the steps of:

providing a piezoelectric filter including a plurality of piezoelectric resonators including a substrate and a vibration portion provided on the substrate, the vibration portion having a structure in which top and bottom surfaces of a thin film portion including at least one piezoelectric thin film are sandwiched between at least a pair of an upper electrode and a lower electrode facing each other and an additional film is provided on the upper electrode of at least one of the plurality of piezoelectric resonators, and the additional film has susceptibility to physical etching that is lower than that of materials used for the upper electrodes of the others of the plurality of piezoelectric resonators; and adjusting the frequency of the at least one of the plurality of piezoelectric resonators by etching the upper electrode of the at least one of the plurality of piezoelectric resonators.

19. A method for adjusting the frequency of a piezoelectric filter comprising the steps of:

providing a piezoelectric filter including a plurality of piezoelectric resonators including a substrate and a vibration portion provided on the substrate, the vibration portion having a structure in which top and bottom surfaces of a thin film portion including at least one piezoelectric thin film are sandwiched between at least a pair of an upper electrode and a lower electrode facing each other, the vibration portions of the plurality of piezoelectric resonators are covered with a protective film, and an additional electrode provided on the upper electrode of at least one of the plurality of piezoelectric resonators with the protective film being located therebetween, wherein the protective film has susceptibility to physical etching that is lower than that of the additional electrode; and adjusting the frequency of the at least one of the plurality of piezoelectric resonators by etching the additional electrode.

20. The method for adjusting the frequency of a piezoelectric filter according to claim 18, further comprising the step of adjusting the frequency of the plurality of piezoelectric resonators by adding a film to the vibration portion or by etching the vibration portion through an opening in the substrate arranged such that the vibration portion is provided on the opening.

21. A method for adjusting the frequency of a piezoelectric filter comprising the steps of:

providing a piezoelectric filter including a plurality of piezoelectric resonators including a piezoelectric substrate and a vibration portion having a structure in which the piezoelectric substrate is sandwiched between at least a pair of an upper electrode and a lower electrode facing each other, the upper electrode of at least one of the plurality of piezoelectric resonators is made of a material having susceptibility to etching that is different from that of the upper electrodes of the other piezoelectric resonators; and adjusting the frequency of the at least one of the plurality of piezoelectric resonators by etching the upper electrode of the at least one of the plurality of piezoelectric resonators.

22. A method for adjusting the frequency of a piezoelectric filter comprising the steps of:

providing a piezoelectric filter including a plurality of piezoelectric resonators including a piezoelectric substrate and a vibration portion having a structure in which the piezoelectric substrate is sandwiched between at least a pair of an upper electrode and a lower electrode facing each other, an additional film provided on the upper electrode of at least one of the plurality of piezoelectric resonators, and the additional film has susceptibility to etching that is different from that of the material for the upper electrode; and adjusting the frequency of the at least one of the plurality of piezoelectric resonators by etching the additional film.

23. The method for adjusting the frequency of a piezoelectric filter according to claim 21, further comprising the step of adjusting the frequency of the at least one of the plurality of piezoelectric resonators by etching a lower electrode of the at least one of the plurality of piezoelectric resonators, the lower electrode being made of a material having susceptibility to etching that is different from that of the lower electrodes of the other piezoelectric resonators.

24. The method for adjusting the frequency of a piezoelectric filter according to claim 21, further comprising the step of adjusting the frequency of the at least one of the plurality of piezoelectric resonators by etching an additional film of a lower electrode after the frequency of the upper electrode is adjusted, the additional film is provided on the lower electrode of at least one of the plurality of piezoelectric resonators, and the additional film has susceptibility to etching that is different from that of the materials for the lower electrodes of the other piezoelectric resonators.

25. The method for adjusting the frequency of a piezoelectric filter according to claim 21, further comprising the step of adjusting the frequency of the at least one of the plurality of piezoelectric resonators by etching a lower electrode after the frequency of the upper electrode is adjusted, the lower electrode being shared among at least a portion of the plurality of piezoelectric resonators.

26. The piezoelectric filter according to claim 1, wherein the additional film is made of Al or $Al_2O_3$.

27. The piezoelectric filter according to claim 14, wherein the upper electrodes of the plurality of piezoelectric resonators are made of the same material.

28. The piezoelectric filter according to claim 14, wherein the additional film is made of Al or $Al_2O_3$.

* * * * *